(12) United States Patent
Mehta et al.

(10) Patent No.: US 10,366,988 B2
(45) Date of Patent: Jul. 30, 2019

(54) SELECTIVE CONTACT ETCH FOR UNMERGED EPITAXIAL SOURCE/DRAIN REGIONS

(71) Applicant: International Business Machines Corporation, Armonk, NY (US)

(72) Inventors: Sanjay C. Mehta, Niskayuna, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 16 days.

(21) Appl. No.: 14/826,956

(22) Filed: Aug. 14, 2015

(65) Prior Publication Data

US 2017/0047325 A1    Feb. 16, 2017

(51) Int. Cl.
| | |
|---|---|
| *H01L 27/088* | (2006.01) |
| *H01L 29/66* | (2006.01) |
| *H01L 21/283* | (2006.01) |
| *H01L 21/02* | (2006.01) |
| *H01L 29/08* | (2006.01) |
| *H01L 29/45* | (2006.01) |
| *H01L 21/8234* | (2006.01) |
| *H01L 29/04* | (2006.01) |

(52) U.S. Cl.
CPC .... *H01L 27/0886* (2013.01); *H01L 21/02167* (2013.01); *H01L 21/283* (2013.01); *H01L 21/823418* (2013.01); *H01L 21/823431* (2013.01); *H01L 29/045* (2013.01); *H01L 29/0847* (2013.01); *H01L 29/45* (2013.01); *H01L 29/66545* (2013.01)

(58) Field of Classification Search
CPC ............................ H01L 27/088; H01L 21/28
USPC ........................ 257/401, 315, 368; 438/586
See application file for complete search history.

(56) References Cited

U.S. PATENT DOCUMENTS

| | | | |
|---|---|---|---|
| 6,291,334 B1 | 9/2001 | Somekh | |
| 6,900,125 B2 * | 5/2005 | Shimizu | ............ H01L 21/76808 257/E21.579 |
| 7,074,527 B2 | 7/2006 | Lu et al. | |

(Continued)

FOREIGN PATENT DOCUMENTS

| | | |
|---|---|---|
| CN | 104183575 | 12/2014 |
| JP | 5559775 | 6/2014 |
| JP | 2014143416 | 8/2014 |

*Primary Examiner* — Sheng-Bai Zhu
(74) *Attorney, Agent, or Firm* — Scully, Scott, Murphy & Presser, P.C.; Daniel P. Morris, Esq.

(57) ABSTRACT

A semiconductor structure includes a plurality of semiconductor material fins located on a surface of a substrate. At least one gate structure straddles over a portion of each semiconductor material fin. Unmerged source-side epitaxial semiconductor material portions are located on an exposed surfaces of each semiconductor material fin and on one side of each gate structure and unmerged drain-side epitaxial semiconductor portions are located on other exposed surfaces of each semiconductor material fin and on another side of each gate structure. An etch stop structure is located between each unmerged source-side and drain-side epitaxial semiconductor material portions. Each etch stop structure includes a bottom material portion that has a higher etch resistance in a specific etchant as compared to an upper material portion of the etch stop structure.

8 Claims, 17 Drawing Sheets

(56) References Cited

U.S. PATENT DOCUMENTS

| | | |
|---|---|---|
| 7,867,917 B2 | 1/2011 | Hohage et al. |
| 8,461,039 B2 | 6/2013 | Lin et al. |
| 8,993,460 B2 | 3/2015 | Lavoie |
| 9,397,008 B1* | 7/2016 | Tung et al. .................. 257/401 |
| 2007/0141842 A1 | 6/2007 | Cho et al. |
| 2010/0090348 A1 | 4/2010 | Park et al. |
| 2010/0155842 A1* | 6/2010 | Anderson et al. ........... 257/347 |
| 2011/0115051 A1 | 5/2011 | Kim et al. |
| 2011/0147812 A1* | 6/2011 | Steigerwald et al. ....... 257/288 |
| 2011/0193175 A1* | 8/2011 | Huang ............. H01L 21/823431 257/386 |
| 2011/0300717 A1* | 12/2011 | Kikuchi ............. H01L 21/0212 438/761 |
| 2012/0032323 A1 | 2/2012 | Matsumoto et al. |
| 2013/0157468 A1* | 6/2013 | Matsuoka et al. ................ 438/703 |
| 2013/0309837 A1* | 11/2013 | Chang et al. ................ 438/424 |
| 2014/0035026 A1* | 2/2014 | Jang ..................... H01L 29/792 257/324 |
| 2014/0217517 A1* | 8/2014 | Cai et al. ...................... 257/401 |
| 2014/0246679 A1 | 9/2014 | Arkun et al. |
| 2014/0273365 A1* | 9/2014 | Wei ................. H01L 21/823821 438/199 |
| 2015/0108544 A1* | 4/2015 | Ching ............. H01L 21/823821 257/192 |
| 2015/0170900 A1 | 6/2015 | Lavoie |
| 2015/0171085 A1* | 6/2015 | Fumitake ............ H01L 27/0924 257/369 |
| 2015/0255542 A1* | 9/2015 | Cai ..................... H01L 29/1054 257/401 |
| 2015/0255604 A1* | 9/2015 | Yang ................... H01L 29/7848 257/192 |
| 2015/0303118 A1* | 10/2015 | Wang ............. H01L 21/823481 257/401 |
| 2015/0372140 A1* | 12/2015 | Liu ..................... H01L 29/7848 257/190 |

\* cited by examiner

SELECTIVE CONTACT ETCH FOR UNMERGED EPITAXIAL SOURCE/DRAIN REGIONS

BACKGROUND

The present application relates to semiconductor technology, and more particularly to a FinFET device containing unmerged source/drain regions and a method in which an etch stop structure is used to protect the unmerged source/drain regions during formation of contact metal structures.

For more than three decades, the continued miniaturization of metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

The use of non-planar semiconductor devices such as, for example, semiconductor fin field effect transistors (FinFETs) is the next step in the evolution of complementary metal oxide semiconductor (CMOS) devices. Semiconductor FinFETs can achieve higher drive currents with increasingly smaller dimensions as compared to conventional planar field effect transistors.

In such semiconductor FinFET devices, the source region and the drain region are typically formed by growing an epitaxial semiconductor material from the exposed surfaces of the semiconductor material fin not protected by a gate structure and a gate spacer. Processes are known for providing merged source regions and merged drain regions. Such processes are however not suitable for 10 nm and beyond devices.

Processes for providing unmerged source regions and unmerged drain regions are also known which can be used for providing 10 nm and beyond devices. Prior art processes of providing unmerged source regions and unmerged drain regions however have several drawbacks/challenges associated therewith. For example, prior art processes of providing unmerged source regions and unmerged drain regions can exhibit a high external resistance, Rext, due to a reduced contact area, and/or a variability of contact height and/or nitride liner consumption during a contact reactive ion etch (RIE) and/or a risk of over-consumption of the epitaxial semiconductor material used to provide the unmerged source/drain regions during a RIE process and/or a metal semiconductor alloy (i.e., silicide) punchthrough in the source/drain regions leading to increased gate to drain leakage.

In view of the above, there is a continued need to provide a method of forming unmerged source/drain regions for finFET devices which avoids at least one of the drawbacks/challenges mentioned above for prior art processes of providing unmerged source/drain regions.

SUMMARY

In one aspect of the present application, a semiconductor structure is provided. In one embodiment of the present application, the semiconductor structure includes a plurality of semiconductor material fins located on a surface of a substrate. At least one gate structure straddles over a portion of each semiconductor material fin of the plurality of semiconductor material fins. Unmerged source-side epitaxial semiconductor material portions are located on exposed surfaces of each semiconductor material fin and on one side of each gate structure and unmerged drain-side epitaxial semiconductor portions are located on other exposed surfaces of each semiconductor material fin and on another side of each gate structure. An etch stop structure is located between each unmerged source-side epitaxial semiconductor material portion and each unmerged drain-side epitaxial semiconductor material portion, wherein each etch stop structure comprises a bottom material portion and an upper material portion, the bottom material portion of the etch stop structure has a higher etch resistance in a specific etchant as compared to the upper material portion of the etch stop structure.

In another aspect of the present application, a method of forming a semiconductor structure is provided. In one embodiment, the method of the present application includes providing a plurality of semiconductor material fins on a surface of a substrate. Next, at least one gate structure is formed straddling over a portion of each semiconductor material fin of the plurality of semiconductor material fins. An unmerged source-side epitaxial semiconductor material portion is epitaxially grown on exposed surfaces of each semiconductor material fin and on one side of each gate structure and an unmerged drain-side epitaxial semiconductor portion is also epitaxially grown on exposed surfaces of each semiconductor material fin and on another side of each gate structure. Next, an etch stop structure is formed between and around each unmerged source-side epitaxial semiconductor material portion and between and around each unmerged drain-side epitaxial semiconductor material portion. Each etch stop structure comprises a bottom material layer and an upper material layer, the bottom material layer of the etch stop structure has a higher etch resistance in a specific etchant as compared to the upper material layer of the etch stop structure. Next, a planarized dielectric material having a topmost surface that is coplanar with a topmost surface of the gate structure is formed. A source-side trench and a drain-side trench are then formed in the planarized dielectric material, wherein the forming of the source-side trench and the drain-side trench exposes the lower material layer of the etch stop structure. Next, the lower material layer of the etch stop structure is removed stopping on each unmerged source-side epitaxial semiconductor material portion and each unmerged drain-side epitaxial semiconductor material portion. Next, a contact metal structure is formed atop each unmerged source-side epitaxial semiconductor material portion and each unmerged drain-side epitaxial semiconductor material portion.

DETAILED DESCRIPTION

Figure 1A:
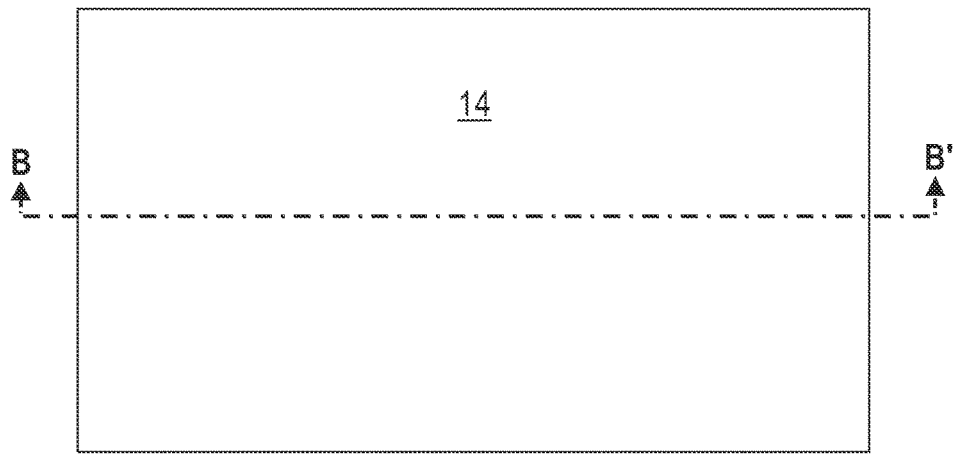
FIG. 1A is a top down view of an exemplary semiconductor structure including, from bottom to top, a handle substrate, an insulator layer and a semiconductor material layer that can be employed in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Figure 1B:
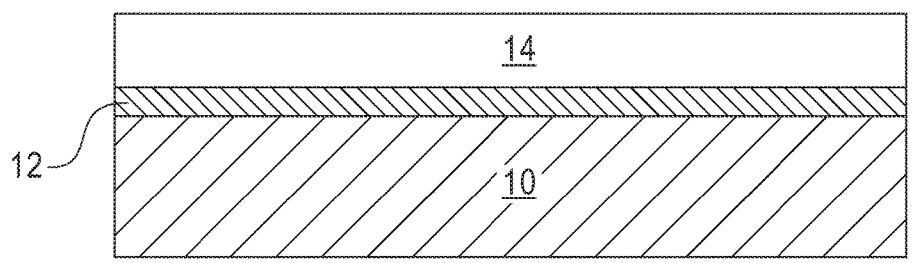
FIG. 1B is a cross sectional view of the exemplary semiconductor structure of FIG. 1A through vertical plane B-B'.

Referring first FIGS. 1A-1B, there are illustrated an exemplary semiconductor structure including, from bottom to top, a handle substrate 10, an insulator layer 12 and a semiconductor material layer 14 that can be employed in accordance with an embodiment of the present application. Collectively, the handle substrate 10, the insulator layer 12 and the semiconductor material layer 14 may be referred to as a semiconductor-on-insulator (SOI) substrate. Although the present application is described and illustrated utilizing an SOI substrate, other semiconductor substrates can also be used including, for example, a semiconductor substrate in which handle substrate 10 is omitted, or a bulk semiconductor substrate in which the entirety of the semiconductor substrate is comprised of a semiconductor material in which at least the topmost semiconductor material of the bulk semiconductor substrate is comprised of semiconductor material layer 14.

In the embodiment illustrated in FIGS. 1A-1B, the semiconductor material layer 14 is present on an uppermost surface of the insulator layer 12. The insulator layer 12 is present on an uppermost surface of the handle substrate 10. The handle substrate 10 provides mechanical support to the insulator layer 12 and the semiconductor material layer 14.

In some embodiments of the present application, the handle substrate 10 and the semiconductor material layer 14 of the SOI substrate may comprise a same semiconductor material. In other embodiments of the present application, the handle substrate 10 and the semiconductor material layer 14 of the SOI substrate may comprise a different semiconductor material. The term "semiconductor" as used herein in connection with the semiconductor material of the handle substrate 10 and the semiconductor material layer 14 denotes any semiconducting material including, for example, Si, Ge, SiGe, SiC, SiGeC, InAs, GaAs, InP or other like III/V compound semiconductors. Multilayers of these semiconductor materials can also be used as the semiconductor material of the handle substrate 10 and the semiconductor material layer 14. In one embodiment, the handle substrate 10 and the semiconductor material layer 14 are both comprised of silicon. In some embodiments, the handle substrate 10 is a non-semiconductor material including, for example, a dielectric material and/or a conductive material.

The handle substrate 10 and the semiconductor material layer 14 may have the same or different crystal orientation. For example, the crystal orientation of the handle substrate 10 and/or the semiconductor material layer 14 may be {100}, {110}, or {111}. Other crystallographic orientations besides those specifically mentioned can also be used in the present application. The handle substrate 10 of the SOI substrate may be a single crystalline semiconductor material, a polycrystalline material, or an amorphous material. Typically, the semiconductor material layer 14 is a single crystalline semiconductor material. In some embodiments (not shown), the semiconductor material layer 14 that is located atop the insulator layer 12 can be processed to include semiconductor regions having different crystal orientations.

The insulator layer 12 of the SOI substrate may be a crystalline or non-crystalline oxide or nitride. In one embodiment, the insulator layer 12 is an oxide such as, for example, silicon dioxide. In another embodiment, the insulator layer 12 is a nitride such as, for example, silicon nitride or boron nitride. In yet other embodiments, the insulator layer 12 is a multilayered stack of, in any order, silicon dioxide and boron nitride.

The SOI substrate may be formed utilizing standard processes including for example, SIMOX (Separation by IMplantation of OXygen) or layer transfer. When a layer transfer process is employed, an optional thinning step may follow the bonding of two semiconductor wafers together. The optional thinning step reduces the thickness of the semiconductor layer to a layer having a thickness that is more desirable.

In some embodiments, the thickness of semiconductor material layer 14 of the SOI substrate is from 10 nm to 100 nm. Other thicknesses that are lesser than, or greater than, the aforementioned thickness range may also be employed in the present application. The insulator layer 12 of the SOI substrate typically has a thickness from 1 nm to 200 nm. Other thicknesses that are lesser than, or greater than, the aforementioned thickness range may also be used as the thickness of the insulator layer 12. The thickness of the handle substrate 10 of the SOI substrate is inconsequential to the present application.

In some embodiments of the present application (not shown), a layer of hard mask material such, as for example, silicon dioxide and/or silicon nitride, can be deposited on the exposed surface of the semiconductor material layer 14 prior to subsequent semiconductor material fin formation. During the subsequent formation of the semiconductor material fins, a portion of the hard mask provides a fin cap on a topmost surface of each semiconductor material fin. In such a structure, the gate dielectric material portion to be subsequently formed is present only along the vertical sidewalls of each semiconductor material fin. In the embodiment that is illustrated, no fin cap is present and as such, the gate dielectric material portion will be present along the vertical sidewalls and on a topmost surface of each semiconductor material fin.

Figure 2A:
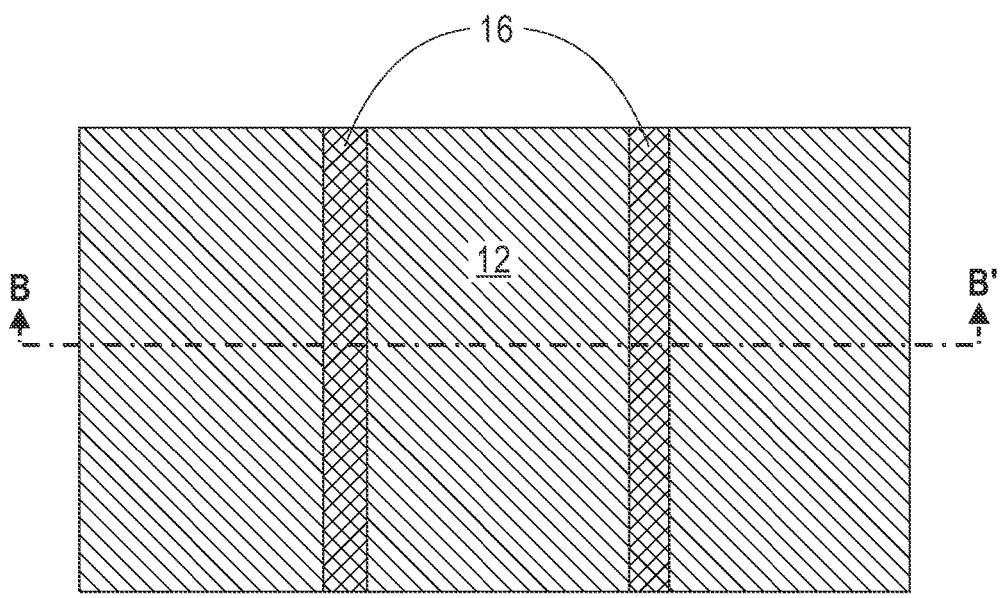
FIG. 2A is a top down view of the exemplary semiconductor structure of FIGS. 1A-1B after patterning the semiconductor material layer to provide a plurality of semiconductor material fins extending upwards from a surface of the insulator layer.
Figure 2B:
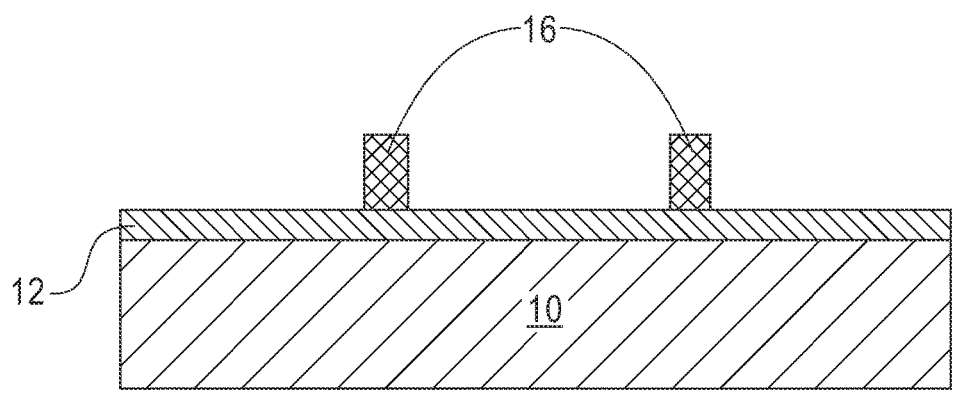
FIG. 2B is a cross sectional view of the exemplary semiconductor structure of FIG. 2A through vertical plane B-B'.

Referring now to FIGS. 2A-2B, there are illustrated the exemplary semiconductor structure of FIGS. 1A-1B after patterning the semiconductor material layer 14 to provide a plurality of semiconductor material fins 16 extending upward from a surface of insulator layer 12. In the top down view, the length of the semiconductor material fins 16 is shown to end at a top edge and a bottom edge of the insulator layer 12. This was performed for clarity only.

In the illustrated embodiment of the present application, each semiconductor material fin 16 of the plurality of semiconductor material fins has a bottommost surface that is located on a surface of the insulator layer 12. Thus, and in the illustrated embodiment, each semiconductor material fin 16 is formed on a surface of a substrate that is provided by insulator layer 12. In such an embodiment, an interface is present between the bottommost surface of each semiconductor material fin 16 and an upper surface of the insulator layer 12.

In other embodiments of the present application (not shown), and when a bulk semiconductor material comprising a single semiconductor material is employed, each semiconductor material fin 16 that is formed has a bottommost surface that is in contact with an underlying semiconductor material. In such an embodiment, no interface is present between the bottommost surface of each semiconductor material fin 16 and an upper surface of the underlying semiconductor material.

In the illustrated embodiment of the present application, each semiconductor material fin 16 that is formed comprises a same semiconductor material as that of the semiconductor material layer 14. When a bulk semiconductor is used as the semiconductor substrate instead of an SOI substrate, each semiconductor material fin 16 that is formed comprises a same semiconductor material as that of an upper semiconductor material portion (i.e., the semiconductor material layer 14) of the bulk semiconductor substrate.

Each semiconductor material fin 16 of the plurality of semiconductor material fins is spaced apart from its nearest neighboring semiconductor material fin(s) 16. Also, each semiconductor material fin 16 of the plurality of semiconductor material fins is oriented parallel to each other. While the present application is illustrated with a plurality of semiconductor material fins, embodiments in which a single semiconductor material fin 16 is employed in lieu of a plurality of semiconductor material fins are expressly contemplated herein.

As used herein, a "semiconductor material fin" refers to a contiguous structure including a semiconductor material and including a pair of vertical sidewalls that are parallel to each other. As used herein, a surface is "vertical" if there exists a vertical plane from which the surface does not device by more than three times the root mean square roughness of the surface.

In one embodiment of the present application, each semiconductor material fin 16 has a height from 10 nm to 100 nm, a width from 4 nm to 30 nm, and a length from 100 nm to 2000 nm. Other heights, and/or widths, and/or lengths that are lesser than, or greater than, the aforementioned ranges may also be employed in the present application.

As mentioned above, each semiconductor material fin 16 can be formed by patterning semiconductor material layer 14. The patterning that provides the semiconductor material fin 16 may be referred to herein as a fin patterning process. In one embodiment, the fin patterning process may include lithography and etching. Lithography includes forming a photoresist material (not shown) atop the semiconductor material layer 14. The photoresist material may include a positive-tone photoresist composition, a negative-tone photoresist composition or a hybrid-tone photoresist composition. The photoresist material may be formed by a deposition process such as, for example, spin-on coating. After forming the photoresist material, the deposited photoresist material is subjected to a pattern of irradiation. Next, the exposed photoresist material is developed utilizing a conventional resist developer. This provides a patterned photoresist atop a portion the semiconductor material layer 14. The pattern provided by the patterned photoresist material is thereafter transferred into the underlying material layers (i.e., optional hard mask and semiconductor material layer 14) utilizing at least one pattern transfer etching process; the etch stops either on a surface of the insulator layer 12 or within a bottom material portion of a bulk semiconductor substrate. Typically, the at least one pattern transfer etching process is an anisotropic etch. In one embodiment, a dry etching process such as, for example, reactive ion etching can be used. In another embodiment, a chemical etchant can be used. In still a further embodiment, a combination of dry etching and wet etching can be used.

In another embodiment of the present application, a sidewall image transfer (SIT) process can be used as the fin patterning process. The SIT process includes forming a contiguous mandrel material layer (not shown) atop the semiconductor material layer 14. The contiguous mandrel material layer (not shown) can include any material (semiconductor, dielectric or conductive) that can be selectively removed from the structure during a subsequently performed etching process. In one embodiment, the contiguous mandrel material layer (not shown) may be composed of amorphous silicon or polysilicon. In another embodiment, the contiguous mandrel material layer (not shown) may be composed of a metal such as, for example, Al, W, or Cu. The contiguous mandrel material layer (not shown) can be formed, for example, by chemical vapor deposition or plasma enhanced chemical vapor deposition. Following deposition of the contiguous mandrel material layer (not shown), the contiguous mandrel material layer (not shown) can be patterned by lithography and etching to form a plurality of mandrel structures (also not shown) on the topmost surface of the structure.

The SIT process continues by forming a dielectric spacer on each sidewall of each mandrel structure. The dielectric spacer can be formed by deposition of a dielectric spacer material and then etching the deposited dielectric spacer material. The dielectric spacer material may comprise any dielectric spacer material such as, for example, silicon dioxide, silicon nitride or a dielectric metal oxide. Examples of deposition processes that can be used in providing the dielectric spacer material include, for example, chemical vapor deposition (CVD), plasma enhanced chemical vapor deposition (PECVD), or atomic layer deposition (ALD). Examples of etching that be used in providing the dielectric spacers include any etching process such as, for example, reactive ion etching.

After formation of the dielectric spacers, the SIT process continues by removing each mandrel structure. Each mandrel structure can be removed by an etching process that is selective for removing the mandrel material. Following the mandrel structure removal, the SIT process continues by transferring the pattern provided by the dielectric spacers into the underlying layers stopping atop the insulator layer 12 or within a bottom material portion of a bulk semiconductor substrate. The pattern transfer may be achieved by utilizing at least one etching process. Examples of etching processes that can used to transfer the pattern may include dry etching (i.e., reactive ion etching, plasma etching, and ion beam etching or laser ablation) and/or a chemical wet etch process. In one example, the etch process used to transfer the pattern may include one or more reactive ion etching steps. Upon completion of the pattern transfer, the SIT process concludes by removing the dielectric spacers from the structure. Each dielectric spacer may be removed by etching or a planarization process.

In embodiments in which a bulk semiconductor structure is used, a trench dielectric material (not shown) such as, for example, silicon dioxide, can be formed between each semiconductor material fin 16. The trench dielectric material can be formed utilizing a deposition process such as, for example, chemical vapor deposition (CVD) or plasma enhanced chemical vapor deposition (PECVD). After deposition of the trench dielectric material, an etch back process can be used to form trench isolation structures on the exposed surfaces of the remaining portion of the bulk semiconductor substrate and at a footprint of each semiconductor material fin 16. This procedure can also be used to form isolation structures (not shown) on exposed portions of the insulator layer 12 and at the footprint of each semiconductor material fin 16.

Figure 3A:
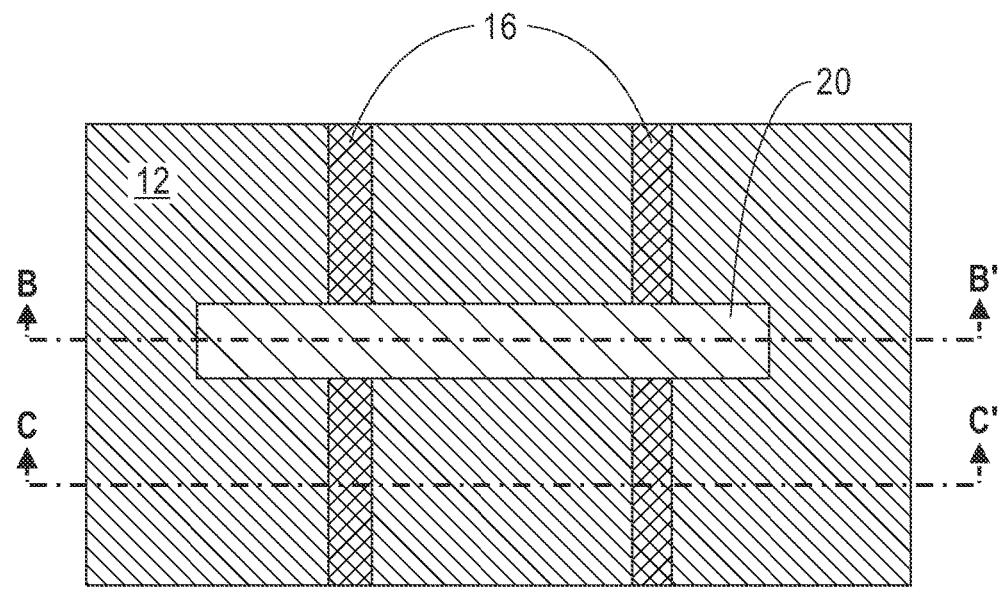
FIG. 3A is a top down view of the exemplary semiconductor structure of FIGS. 2A-2B after forming a gate structure straddling over a portion of each semiconductor material fin of the plurality of semiconductor material fins.
Figure 3B:
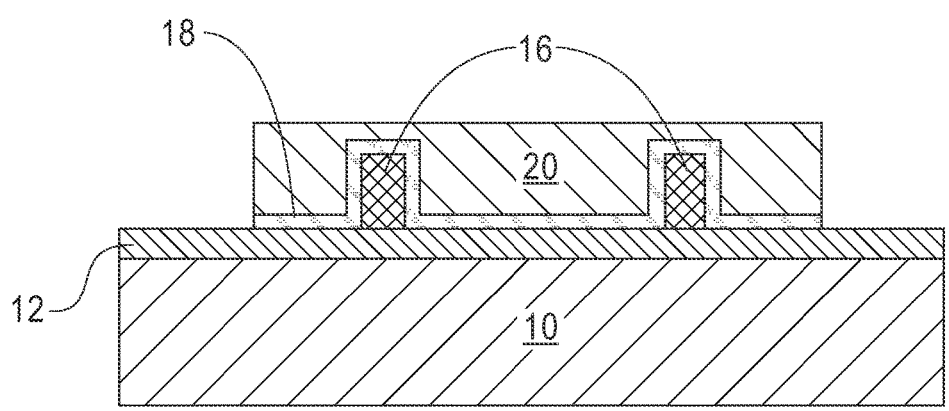
FIG. 3B is a cross sectional view of the exemplary semiconductor structure of FIG. 3A through vertical plane B-B'.
Figure 3C:
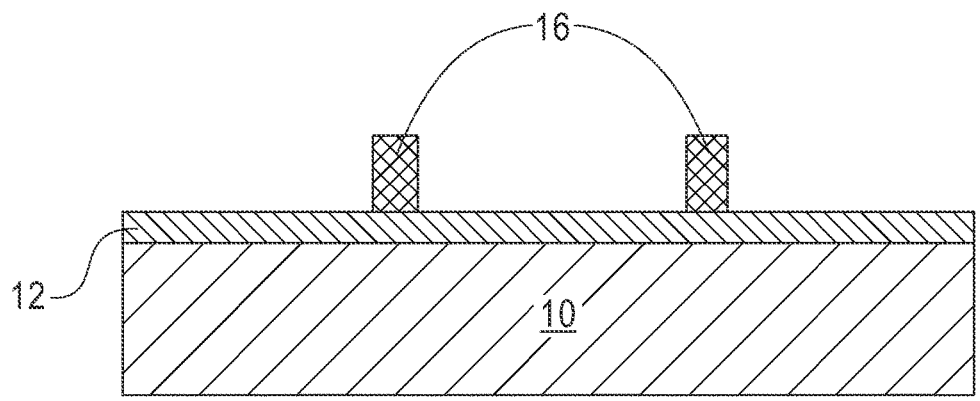
FIG. 3C is a cross sectional view of the exemplary semiconductor structure of FIG. 3A through vertical plane C-C'.

Referring now to FIGS. 3A-3C, there are illustrated the exemplary semiconductor structure of FIGS. 2A-2B after forming a gate structure (18, 20) straddling over a portion of each semiconductor material fin 16; although a single gate structure is described and illustrated a plurality of gate structures (that are orientated parallel to each other) can be formed over different portions of each semiconductor material fin 16. By "straddling over" it is meant that at least one portion of each gate structure is located on one side of each semiconductor material fin 16 and another portion of each gate structure is located on another side of each semiconductor material fin 16. These two gate portions of the gate structure are interconnected by a portion of the gate structure that is located directly atop the semiconductor material fin 16. As shown in the illustrated embodiment, a portion of the gate structure (18, 20) contacts a topmost surface of insulator layer 12. Typically, other gate structures are formed at the two edges of the semiconductor material fin 16 at the top and bottom of the top down view shown in the present application.

In one embodiment (and as shown), the gate structure is a functional gate structure. By "functional gate structure" it is meant a permanent gate structure used to control output current (i.e., flow of carriers in the channel) of a semiconducting device through electrical or magnetic fields. The functional gate structure includes a gate material stack of, from bottom to top, a gate dielectric portion 18 and a gate conductor portion 20. In some embodiments, a gate cap portion not shown) can be present atop the gate conductor portion 20.

The gate dielectric portion 18 of the functional gate structure comprises a gate dielectric material. The gate dielectric material that provides the gate dielectric portion 18 can be an oxide, nitride, and/or oxynitride. In one example, the gate dielectric material that provides the gate dielectric portion 18 can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric, can be formed and used as the gate dielectric portion 18. In some embodiments and when multiple functional gate structures are formed, each gate dielectric portion comprises a same gate dielectric material. In other embodiments and when multiple functional gate structures are formed, the gate dielectric portion for a first set of the functional gate structures comprises a different gate dielectric material than the gate dielectric portion for a second set of the functional gate structures.

The gate dielectric material used in providing the gate dielectric portion 18 can be formed by any deposition process including, for example, chemical vapor deposition (CVD), plasma enhanced chemical vapor deposition (PECVD), physical vapor deposition (PVD), sputtering, or atomic layer deposition. In some embodiments and when different gate dielectric materials are used in providing the gate dielectric portions, block mask technology can be used. In one embodiment of the present application, the gate dielectric material used in providing the gate dielectric portion 18 can have a thickness in a range from 1 nm to 10 nm. Other thicknesses that are lesser than, or greater than, the aforementioned thickness range can also be employed for the gate dielectric material.

The gate conductor portion 20 of the functional gate structure comprises a gate conductor material. The gate conductor material used in providing the gate conductor portion 20 can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In some embodiments and when multiple functional gate structures are formed, the gate conductor portion of each functional gate structure is a same conductive material. In other embodiments and when multiple functional gate structures are formed, the gate conductor portion of a first set of functional gate structures comprises a different gate conductor material than the gate conductor portion of a second set of functional gate structure. For example, the gate conductor portion of a first set of functional gate structures may comprise an nFET gate metal, while the gate conductor portion of a second set of functional gate structures may comprise a pFET gate metal.

The gate conductor material used in providing the gate conductor portion 20 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. When a different gate conductor material is used for the gate conductor portion of different functional gate structures, block mask technology can be used. In one embodiment, the gate conductor material used in providing the gate conductor portion 20 has a thickness from 50 nm to 100 nm. Other thicknesses that are lesser than, or greater than, the aforementioned thickness range can also be employed for the gate conductor material used in providing the gate conductor portion 20.

If present, the gate cap portion of the functional gate structure comprises a gate cap material. The gate cap material that provides the gate cap portion may include one of the hard mask materials mentioned above. In one embodiment, each gate cap portion comprises silicon dioxide, silicon nitride, and/or silicon oxynitride. The material that provides the gate cap portion can be formed utilizing a conventional deposition process such as, for example, chemical vapor deposition or plasma enhanced chemical vapor deposition. The material that provides the gate cap portion can has a thickness from 5 nm to 20 nm. Other thicknesses that are lesser than, or greater than, the aforementioned thickness range can also be employed as the thickness of the material that provides the gate cap portion.

The functional gate structure can be formed by providing a functional gate material stack of, from bottom to top, the gate dielectric material, the gate conductor material and, if present, the gate cap material. The gate material stack can then be patterned. In one embodiment of the present application, patterning of the functional gate material stack may be performed utilizing lithography and etching, as defined above.

In other embodiments of the present application, and prior to forming functional gate structure, a sacrificial gate structure is formed instead of a functional gate structure. In yet other embodiments and when multiple gate structures are formed, at least one of the gate structures is a functional gate structure, and at least one other of the gate structures is a sacrificial gate structure. By "sacrificial gate structure" it is meant a material or material stack that serves as a placeholder for a subsequently formed functional gate structure. In such a process, the functional gate structure is formed after the source/drain regions have been formed. In such an embodiment, the gate dielectric portion of the functional gate structure that replaces the sacrificial gate structure may be U-shaped. By "U-shaped" it is meant a material that includes a bottom horizontal surface and a sidewall surface that extends upward from the bottom horizontal surface. When employed, each sacrificial gate structure may include a sacrificial gate dielectric portion, a sacrificial gate material portion and a sacrificial gate cap portion. In some embodiments, each sacrificial gate dielectric portion and/or each sacrificial gate cap portion may be omitted. Each sacrificial gate dielectric portion includes one of the dielectric materials mentioned above for the gate dielectric portion. Each sacrificial gate material portion includes one of the gate conductor materials mentioned above for the gate conductor portion. The sacrificial gate cap portion includes one of the gate cap materials mentioned above for each gate cap portion. The sacrificial gate structures can be formed by deposition of the various material layers and then patterning the resultant sacrificial material stack by utilizing, for example, lithography and etching.

Figure 4A:
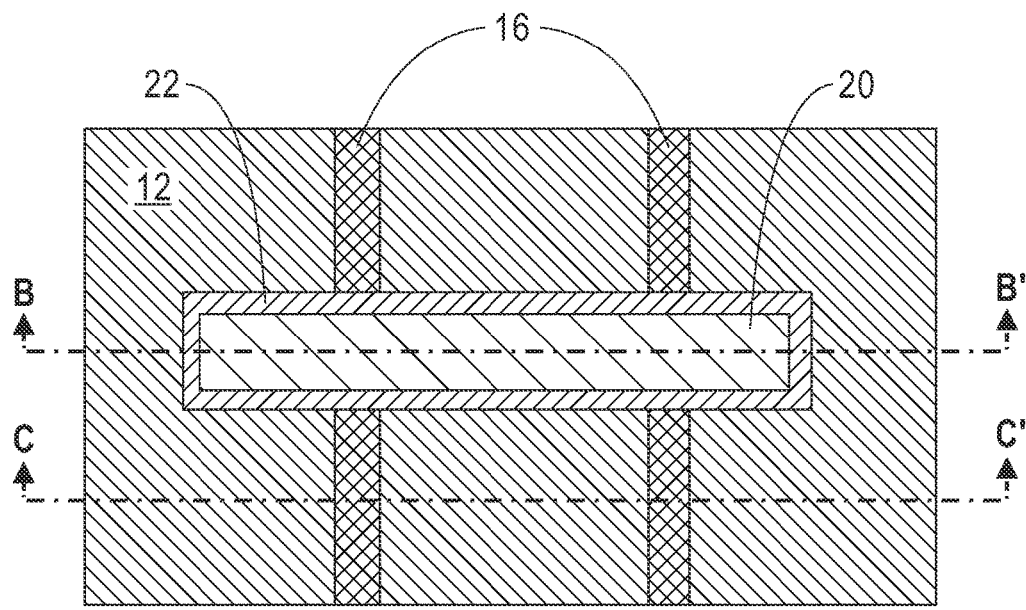
FIG. 4A is a top down view of the exemplary semiconductor structure of FIGS. 3A-3C after forming a dielectric spacer on sidewalls of each gate structure and straddling over another portion of each semiconductor material fin of the plurality of semiconductor material fins.
Figure 4B:
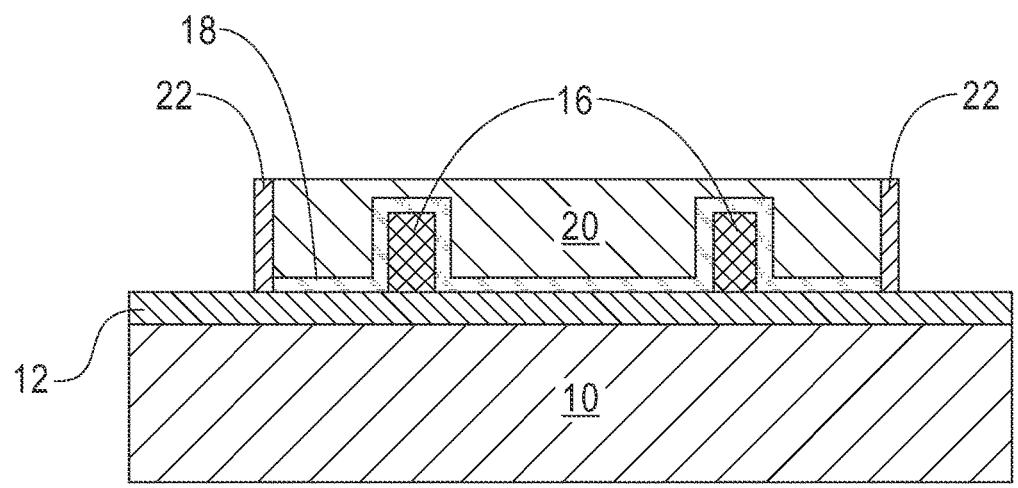
FIG. 4B is a cross sectional view of the exemplary semiconductor structure of FIG. 4A through vertical plane B-B'.
Figure 4C:
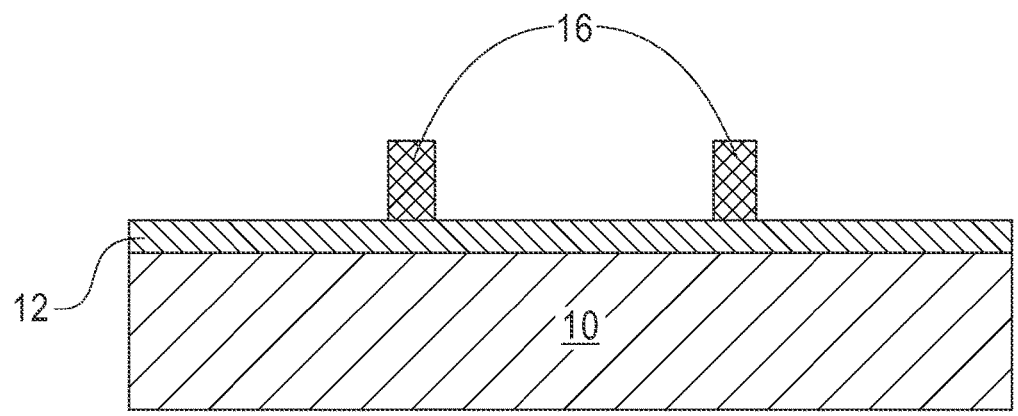
FIG. 4C is a cross sectional view of the exemplary semiconductor structure of FIG. 4A through vertical plane C-C'.

Referring now to FIGS. 4A-4C, there are illustrated the exemplary semiconductor structure of FIGS. 3A-3C after forming a dielectric spacer 22 on sidewalls of each gate structure (18, 20) and straddling over another portion of each semiconductor material fin 16 of the plurality of semiconductor material fins. Each dielectric spacer 22 may comprise one of the dielectric materials mentioned above for dielectric spacers used in the SIT process. Each dielectric spacer 22 can be formed by depositing a spacer material and thereafter a spacer etch can be performed.

Figure 5A:
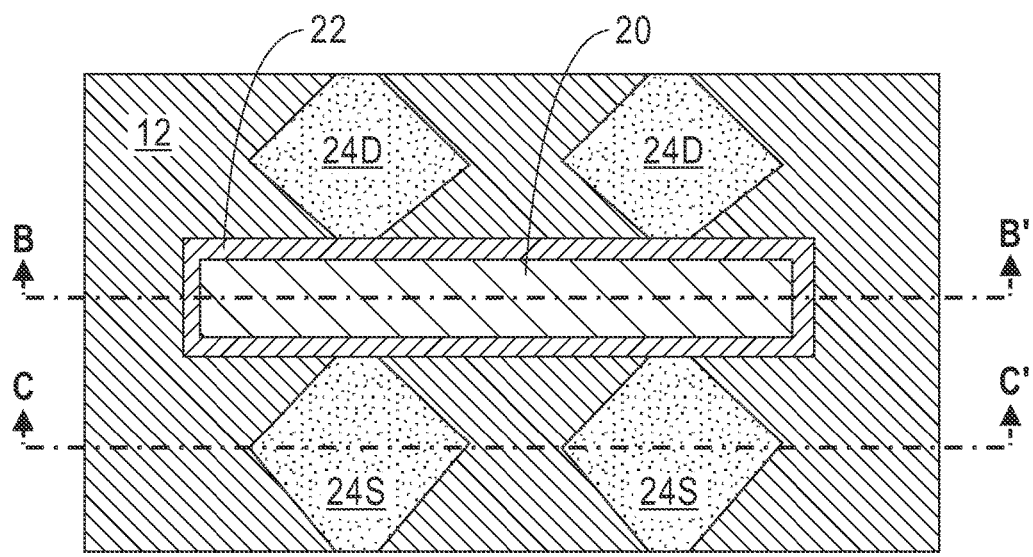
FIG. 5A is top down view of the exemplary semiconductor structure of FIGS. 4A-4C after forming unmerged source-side epitaxial semiconductor material portions on one side of each gate structure and forming unmerged drain-side epitaxial semiconductor material portions on another side of each gate structure.
Figure 5B:
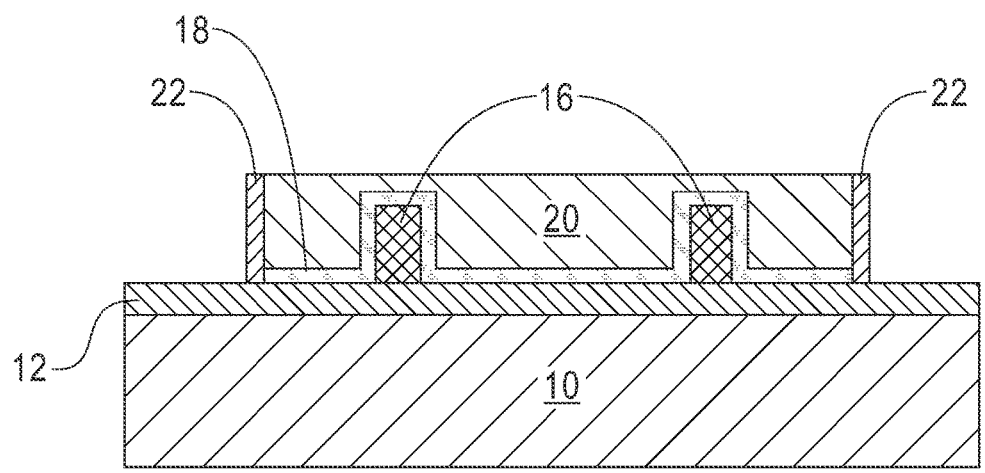
FIG. 5B is a cross sectional view of the exemplary semiconductor structure of FIG. 5A through vertical plane B-B'.

Referring now to FIGS. 5A-5B, there are illustrated the exemplary semiconductor structure of FIGS. 4A-4C after forming unmerged source-side epitaxial semiconductor material portions 24S on one side of each gate structure (18, 20) and forming unmerged drain-side epitaxial semiconductor material portions 24D on another side of each gate structure (18, 20). In accordance with the present application, each unmerged source-side epitaxial semiconductor material portion 24S can be used in providing a source region of the FinFET device, while each unmerged drain-side epitaxial semiconductor material portion 24D may be used in providing a drain region of the FinFET device. In the drawings, cross sectional C-C' is through the source region of the device. While not shown, a cross sectional view through the drain region of the device would look similar to that shown in C-C'.

Each unmerged source-side epitaxial semiconductor material portion 24S and each unmerged drain-side epitaxial semiconductor material portion 24D are formed utilizing a selective epitaxially growth (or deposition) process from exposed sidewalls of each semiconductor material fin 16 and from an exposed topmost surface of each semiconductor material fin 16. Each unmerged source-side epitaxial semiconductor material portion 24S and each unmerged drain-side epitaxial semiconductor material portion 24D have a faceted (i.e., not planar) topmost surface. In some embodiments of the present application, each unmerged source-side epitaxial semiconductor material portion 24S and each unmerged drain-side epitaxial semiconductor material portion 24D is diamond shaped. In such an embodiment, each unmerged source-side epitaxial semiconductor material portion 24S and each unmerged drain-side epitaxial semiconductor material portion 24D may be a <111> bound diamond shaped epitaxy semiconductor material.

Each unmerged source-side epitaxial semiconductor material portion 24S includes an n-type (i.e., at least one element from Group VA of the Periodic Table of Elements (e.g., P and/or As)) or a p-type dopant (i.e., at least one element from Group IIIA of the Periodic Table of Elements (e.g., Al and/or B)) and a semiconductor material. The semiconductor material of each unmerged source-side epitaxial semiconductor material portion 24S may include any of the semiconductor materials mentioned above for semiconductor material layer 14. In one embodiment of the present application, the semiconductor material of each unmerged source-side epitaxial semiconductor material portion 24S is a same semiconductor material as that of semiconductor material layer 14. In another embodiment, the semiconductor material of each unmerged source-side epitaxial semiconductor material portion 24S is a different semiconductor material than semiconductor material layer 14. For example, when semiconductor material layer 14 is comprised of silicon, then each unmerged source-side epitaxial semiconductor material portion 24S may be comprised of SiGe.

Each unmerged drain-side epitaxial semiconductor material portion 24D includes an n-type (i.e., at least one element from Group VA of the Periodic Table of Elements (e.g., P and/or As) or a p-type dopant (i.e., at least one element from Group IIIA of the Periodic Table of Elements (e.g., Al and/or B) and a semiconductor material. The semiconductor material of each unmerged drain-side epitaxial semiconductor material portion 24D may include any of the semiconductor materials mentioned above for semiconductor material layer 14. In one embodiment of the present application, the semiconductor material of each unmerged drain-side epitaxial semiconductor material portion 24D is a same semiconductor material as that of semiconductor material layer 14. In another embodiment, the semiconductor material of each unmerged drain-side epitaxial semiconductor material portion 24D is a different semiconductor material than semiconductor material layer 14. For example, when semiconductor material layer 14 is comprised of silicon, then each unmerged drain-side epitaxial semiconductor material portion 24D may be comprised of SiGe. In accordance with the present application, the semiconductor material of each unmerged source-side epitaxial semiconductor material portion 24S is a same semiconductor material as that of the semiconductor material of each unmerged drain-side epitaxial semiconductor material portion 24D.

Each unmerged source-side epitaxial semiconductor material portion 24S and each unmerged drain-side epitaxial semiconductor material portion 24D can be formed by a selective epitaxial growth process; by "selective" it is meant that the epitaxial semiconductor material forms only on exposed surfaces of semiconductor material, i.e., the semiconductor material fin 16, and not on dielectric surfaces, such as silicon dioxide or silicon nitride surfaces. In some embodiments, the selective epitaxial growth process is an in-situ doped selective epitaxial doped process. In such an embodiment, a dopant source gas is introduced during the deposition process. In some other embodiments, the selective epitaxial growth process forms an epitaxial semiconductor material that is intrinsic (i.e., non-doped) and the dopants can be introduced after deposition by one of ion implantation or gas phase doping.

The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. Thus, each unmerged source-side epitaxial semiconductor material portion 24S and each unmerged drain-side epitaxial semiconductor material portion 24D has an epitaxial relationship with the growth surface (i.e., sidewall surfaces and topmost surface) of each semiconductor material fin 16.

Examples of various epitaxial growth process apparatuses that are suitable for use in forming each unmerged source-side epitaxial semiconductor material portion 24S and each unmerged drain-side epitaxial semiconductor material portion 24D of the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition process for typically ranges from 550° C. to 900° C. Although higher temperature typically results in faster deposition, the faster deposition may result in crystal defects and film cracking.

A number of different sources may be used for the deposition of each unmerged source-side epitaxial semiconductor material portion 24S and each unmerged drain-side epitaxial semiconductor material portion 24D. In some embodiments, the gas source for the deposition of epitaxial semiconductor material includes a silicon containing gas source, a germanium containing gas source, or a combination thereof. For example, an epitaxial Si layer may be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

In one embodiment, the dopant is present in each unmerged source-side epitaxial semiconductor material portion 24S and each unmerged drain-side epitaxial semiconductor material portion 24D in a concentration ranging from $1 \times 10^{19}$ atoms/cm$^3$ to $10^{21}$ atoms/cm$^3$. The concentration of dopant within each unmerged source-side epitaxial semiconductor material portion 24S can be equal to, greater than, or less than the concentration of dopant within each unmerged drain-side epitaxial semiconductor material portion 24D.

In one embodiment of the present application, the dopant can be uniformly present in each unmerged source-side epitaxial semiconductor material portion 24S and/or each unmerged drain-side epitaxial semiconductor material portion 24D. In another of the present application, the dopant can be present as a gradient in each unmerged source-side epitaxial semiconductor material portion 24S and/or each unmerged drain-side epitaxial semiconductor material portion 24D.

The thickness of each unmerged source-side epitaxial semiconductor material portion 24S and each unmerged drain-side epitaxial semiconductor material portion 24D may range from 2 nm to 100 nm. Other thicknesses are possible. Each unmerged source-side epitaxial semiconductor material portion 24S may have a thickness that is equal to, greater than, or less than the thickness of each unmerged drain-side epitaxial semiconductor material portion 24D.

After forming each unmerged source-side epitaxial semiconductor material portion 24S and each unmerged drain-side epitaxial semiconductor material portion 24D, annealing can be performed. The anneal causes diffusion of dopant from each unmerged source-side epitaxial semiconductor material portion 24S downwards into a portion of a corresponding semiconductor material fin 16 forming a source region 16S, and diffusion of dopant from each unmerged drain-side epitaxial semiconductor material portion 24S downwards into another portion of a corresponding semiconductor material fin 16 forming a drain region (not specifically shown). The anneal process used in forming the source region 16S and the drain region may be a rapid thermal anneal, furnace annealing, flash annealing, laser annealing or any suitable combination of those techniques. The annealing temperature may range from 600° to 1300° C. with an anneal time ranging from a millisecond to 30 minutes. In one embodiment, the annealing is done by a flash anneal process at about 1200° C. for twenty (20) milliseconds. Each source region 16S is laterally spaced apart from a corresponding drain region by a remaining portion of the semiconductor material fin 16. The remaining portion of each semiconductor material fin 16 may be referred to herein as a body (or channel) region.

Figure 5C:
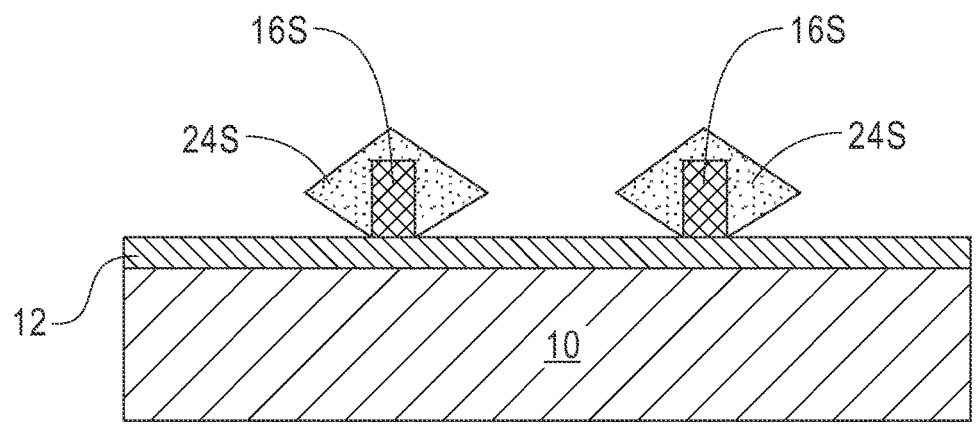
FIG. 5C is a cross sectional view of the exemplary semiconductor structure of FIG. 5A through vertical plane C-C'.
Figure 6A:
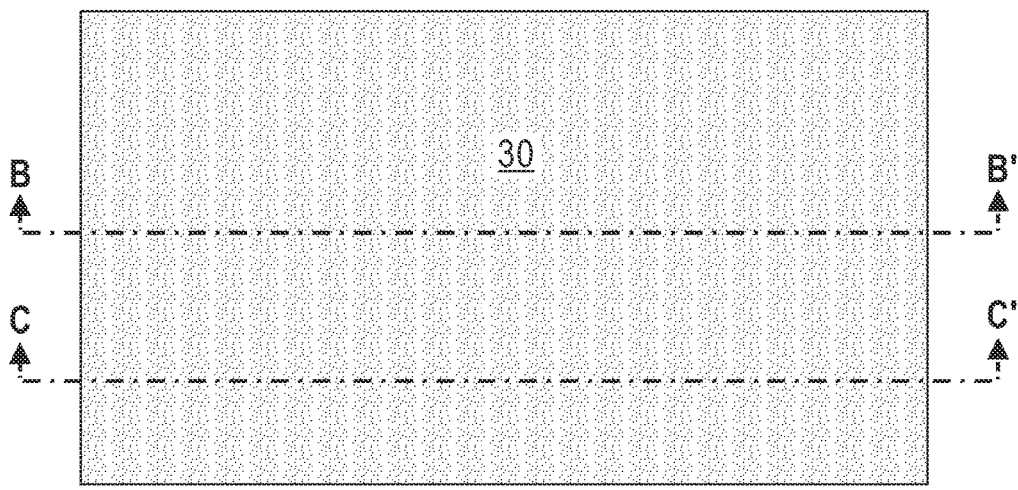
FIG. 6A is top down view of the exemplary semiconductor structure of FIGS. 5A-5C after forming an etch stop structure.
Figure 6B:
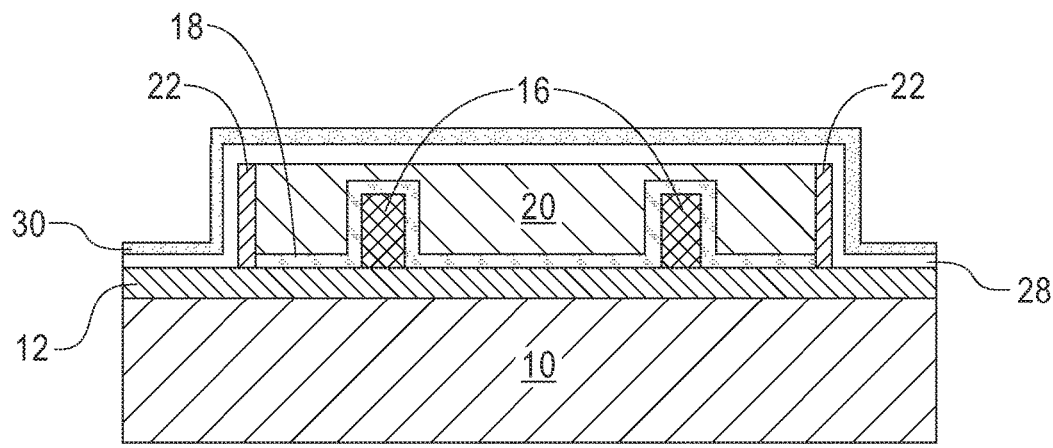
FIG. 6B is a cross sectional view of the exemplary semiconductor structure of FIG. 6A through vertical plane B-B'.
Figure 6C:
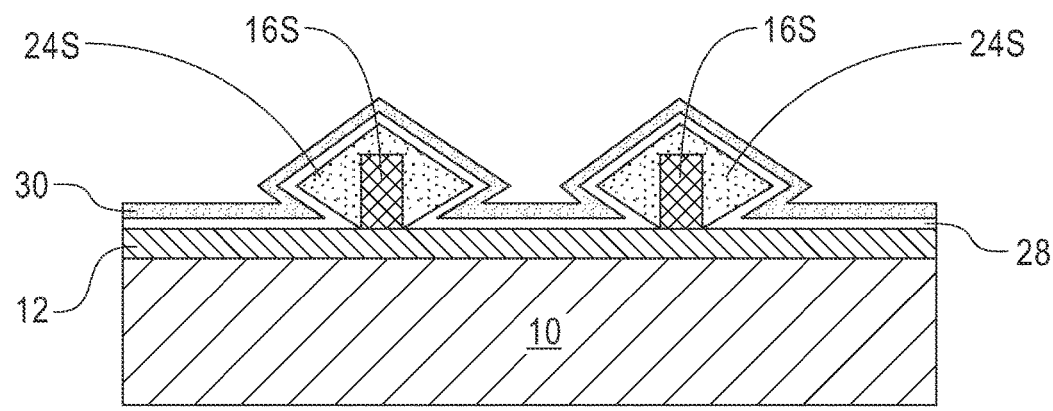
FIG. 6C is a cross sectional view of the exemplary semiconductor structure of FIG. 6A through vertical plane C-C'.

Referring now to FIGS. 6A-6C, there are illustrated the exemplary semiconductor structure of FIGS. 5A-5C after forming an etch stop structure (28, 30). The etch stop structure (28, 30) is a contiguous (i.e., without any material breaks) bilayered structure that is formed on the exposed surfaces of the structure shown in FIGS. 5A-5C. Notably, the etch stop structure (28, 30) of the present application includes a bottom material layer 28 that comprises a material that has a higher etch resistance in a specific etchant as compared to material that comprises an upper material layer 30 of the etch stop structure (28, 30). The bottom material layer 28 of the etch stop structure protects each unmerged source-side epitaxial semiconductor material portion 24S and each unmerged drain-side epitaxial semiconductor material portion 24D during subsequent formation of the contact metal structures. The bottom material layer 28 of the etch stop structure minimizes any erosion and/or consumption of the unmerged source-side epitaxial semiconductor material portions 24S and the unmerged drain-side epitaxial semiconductor material portions 24D during subsequent etching processes utilized in providing the contact metal structures. Furthermore, the bottom material layer 28 prevents any damage to the unmerged source-side epitaxial semiconductor material portion 24S and each unmerged drain-side epitaxial semiconductor material portion 24D during subsequent processing steps used to provide the contact metal structures.

In one embodiment of the present application, the bottom material layer 28 of the etch stop structure of the present application consists of conformal amorphous carbon and the upper material layer 30 of the etch stop structure consists of silicon nitride. In another embodiment of the present application, the bottom material layer 28 of the etch stop structure consists of SiCN having a first C content, and the upper material layer 30 of the etch stop structure consists of SiCN having a second C content, wherein the second C content is less than the first C content and may include no carbon whatsoever. In one embodiment, the first C content is from 10 atomic % to 22 atomic %, and the second C content is from 0 atomic percent to 10 atomic percent.

The etch stop structure (28, 30) may be formed utilizing a single deposition process or a first deposition process can be used to provide the bottom material layer 28 of the etch stop structure, while a second deposition process can be used to provide the upper material layer 30 of the etch stop structure. Examples of deposition processes that can be used in providing the etch stop structure include, but are not limited to, chemical vapor deposition or plasma enhanced chemical vapor deposition.

The bottom material layer 28 of the etch stop structure may have a thickness from 2 nm to 10 nm, while the upper material layer 30 of the etch stop layer 30 may have a thickness that is also within the range from 2 nm to 10 nm. Other thicknesses that are lesser than, or greater than, the aforementioned thickness ranges may also be used for the bottom material layer 28 and the upper material layer 30 of the etch stop structure.

As is shown, the bottom material layer 28 of the etch stop structure directly contacts the exposed surfaces of each unmerged source-side epitaxial semiconductor material portion 24S and each unmerged drain-side epitaxial semiconductor material portion 24D. The bottom material layer 28 of the etch stop structure is also present on exposed surfaces of the dielectric spacer 22 and gate structure (18, 20) mentioned above.

Figure 7A:
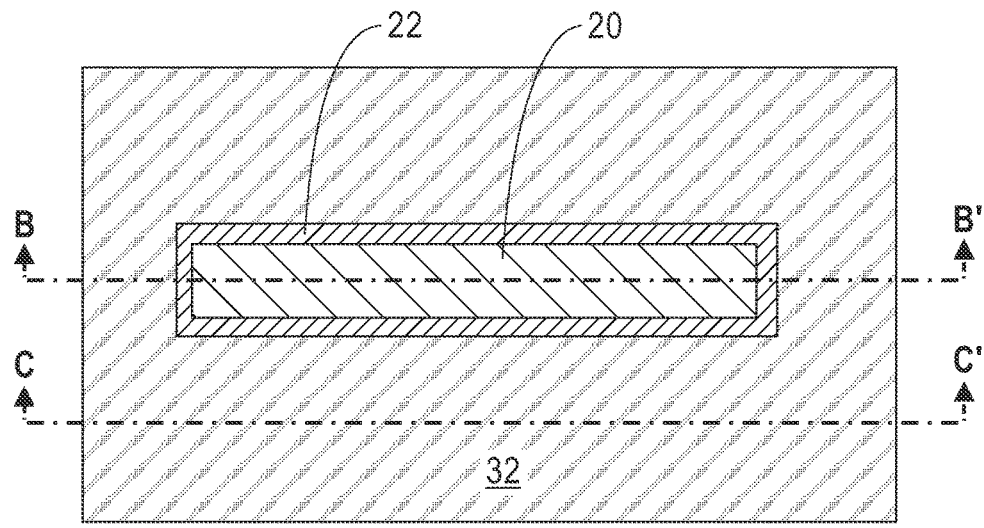
FIG. 7A is top down view of the exemplary semiconductor structure of FIGS. 6A-6C after forming a middle-of-the-line (MOL) dielectric material and planarizing to a topmost surface of each gate structure.
Figure 7B:
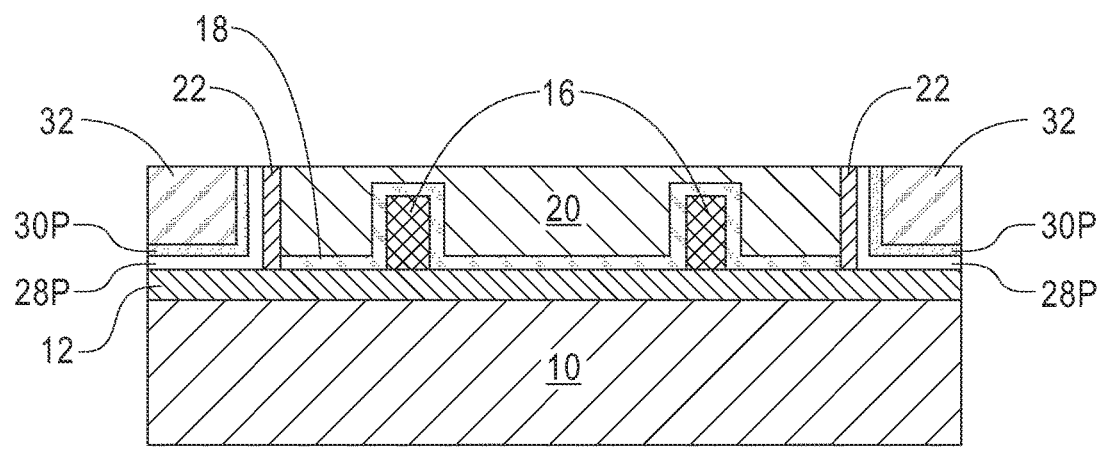
FIG. 7B is a cross sectional view of the exemplary semiconductor structure of FIG. 7A through vertical plane B-B'.
Figure 7C:
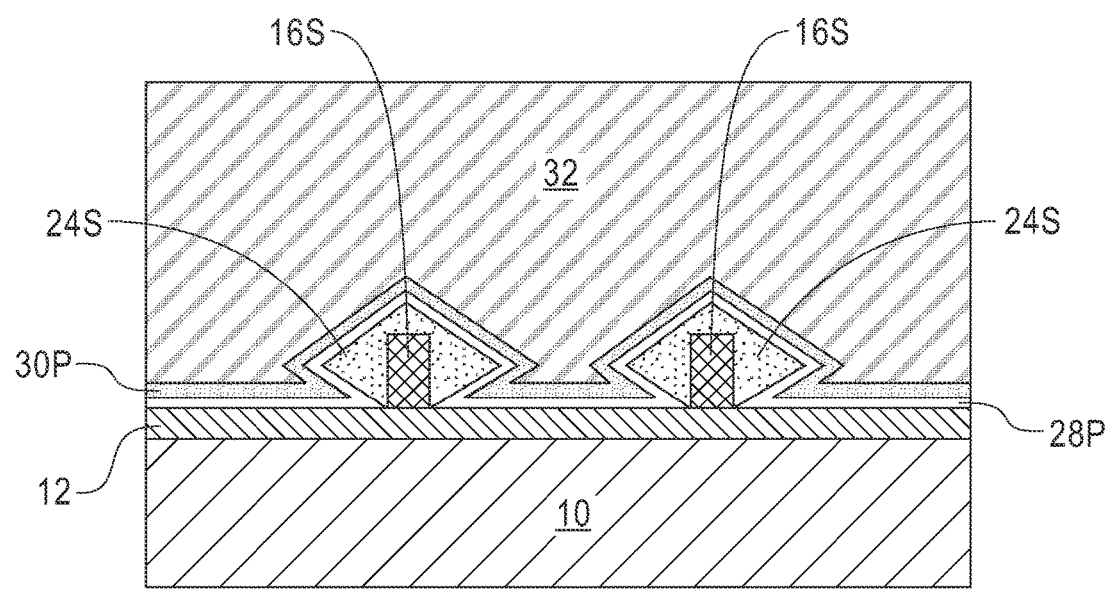
FIG. 7C is a cross sectional view of the exemplary semiconductor structure of FIG. 7A through vertical plane C-C'.

Referring now to FIGS. 7A-7C, there are illustrated the exemplary semiconductor structure of FIGS. 6A-6C after forming a middle-of-the-line (MOL) dielectric material and planarizing to a topmost surface of each gate structure (18, 20). After planarization of the middle-of-the-line (MOL) dielectric material, a planarized dielectric material 32 is formed. The planarized dielectric material 32 has a topmost surface that is coplanar with a topmost surface of the gate structure (18, 20) and a topmost surface of the dielectric spacer 22 and is present on each sidewall surface of the dielectric spacer 22. The planarization process removes portions of the etch stop structure from atop the gate structure (18, 20) and the dielectric spacer 22. Each remaining upper material layer of the etch stop structure is referred to herein as an upper material portion 30P, and each remaining lower material layer of the etch stop structure is referred to herein as a lower material portion 28P.

In some embodiments, the middle-of-the-line (MOL) dielectric material may be composed of, for example, silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. In one embodiment, the middle-of-the-line (MOL) dielectric material can be formed utilizing a deposition process including, for example, chemical vapor deposition (CVD), plasma enhanced chemical vapor deposition (PECVD), evaporation or spin-on coating. After deposition of the middle-of-the-line (MOL) dielectric material, a planarization process such as, for example, chemical mechanical polishing, can be employed. During planarization, portions of the etch stop structure (28, 30) that are present atop the gate structure (18, 20) can be removed. In some embodiments and when sacrificial gate structures are used, the structure gate structures can now be replaced with functional gate structures.

Figure 8A:
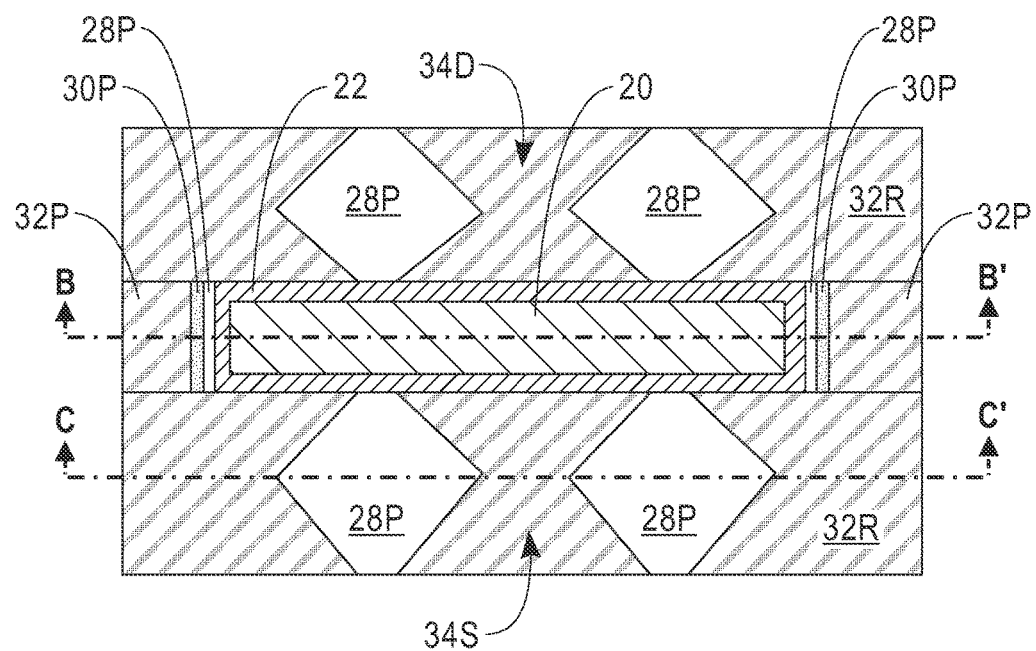
FIG. 8A is top down view of the exemplary semiconductor structure of FIGS. 7A-7C after forming a source-side trench and a drain-side trench by lithography and etching, wherein the etching stops on a surface of a bottom material layer of the etch stop structure that is located over each unmerged source-side epitaxial semiconductor material portion and each unmerged drain-side epitaxial semiconductor material portion.
Figure 8B:
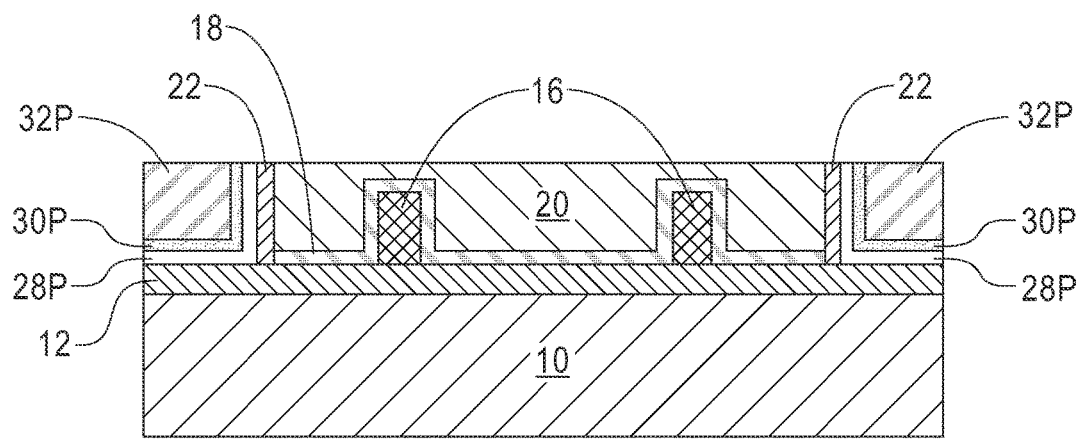
FIG. 8B is a cross sectional view of the exemplary semiconductor structure of FIG. 8A through vertical plane B-B'.
Figure 8C:
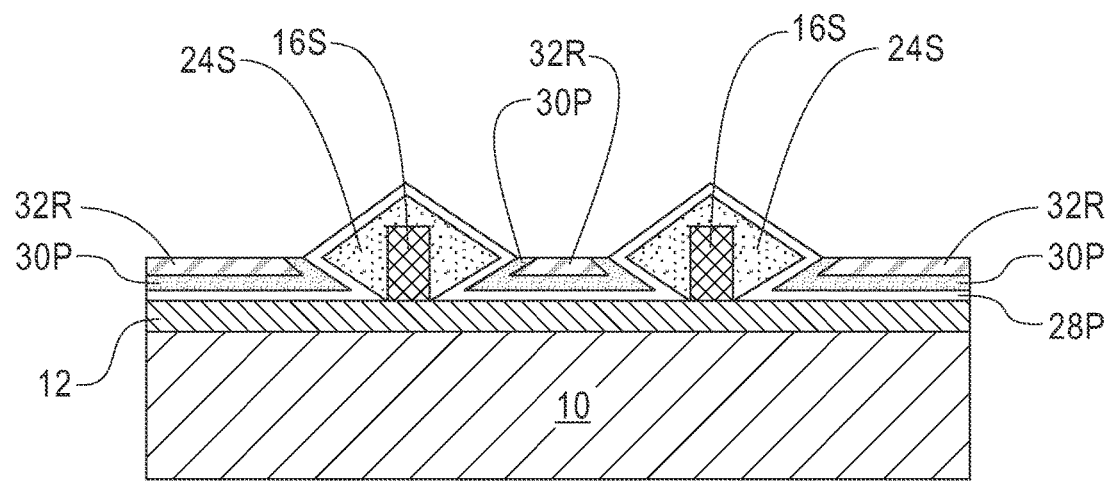
FIG. 8C is a cross sectional view of the exemplary semiconductor structure of FIG. 8A through vertical plane C-C'.

Referring now to FIGS. 8A-8C, there are illustrated the exemplary semiconductor structure of FIGS. 7A-7C after forming a source-side trench 34S and a drain-side trench 34D by lithography and etching, wherein the etching stops on a surface of the bottom material portion 28P of the etch stop structure that is located over each unmerged source-side epitaxial semiconductor material portion 24S and each unmerged drain-side epitaxial semiconductor material portion 24D. The etching step used to provide the source-side trench 34S and the drain-side trench 34D removes the planarized dielectric material 32 and the upper material portion 30P of the etch stop structure from the regions (i.e., source/drain regions) of the exemplary semiconductor structure including the unmerged source-side epitaxial semiconductor material portions 24S and the unmerged drain-side epitaxial semiconductor material portions 24D. In some embodiments (not shown), all of the planarized dielectric material 32 is removed within the source/drain regions. In other embodiments (as shown), a portion of the planarized dielectric material 32 may remain between each unmerged source-side epitaxial semiconductor material portion 24S and each unmerged drain-side epitaxial semiconductor material portion 24D. Each remaining portion of the planarized dielectric material 32 that is located beneath the patterned photoresist provided by the lithographic step may be referred to herein as a planarized dielectric material portion 32P; each remaining portion of the planarized dielectric material within the source-side trench 34S and the drain-side trench 34D is referred to herein as a recessed dielectric material portion 32R; the height of 32R is less than the height of 32P. As is shown, the recessed dielectric material portions 32R protects the underlying etch stop structure from being removed during this step of the present application. Each recessed dielectric material portion 32R has a topmost surface that is beneath a topmost surface of each unmerged source-side epitaxial semiconductor material portion 24S and each unmerged drain-side epitaxial semiconductor material portion 24D. The etch may be a single etch or multiple etching steps can be used to provide the exemplary semiconductor structure shown in FIGS. 8A-8C. In one example, at least one reactive ion etch is utilized to provide the exemplary semiconductor structure shown in FIGS. 8A-8C.

Figure 9A:
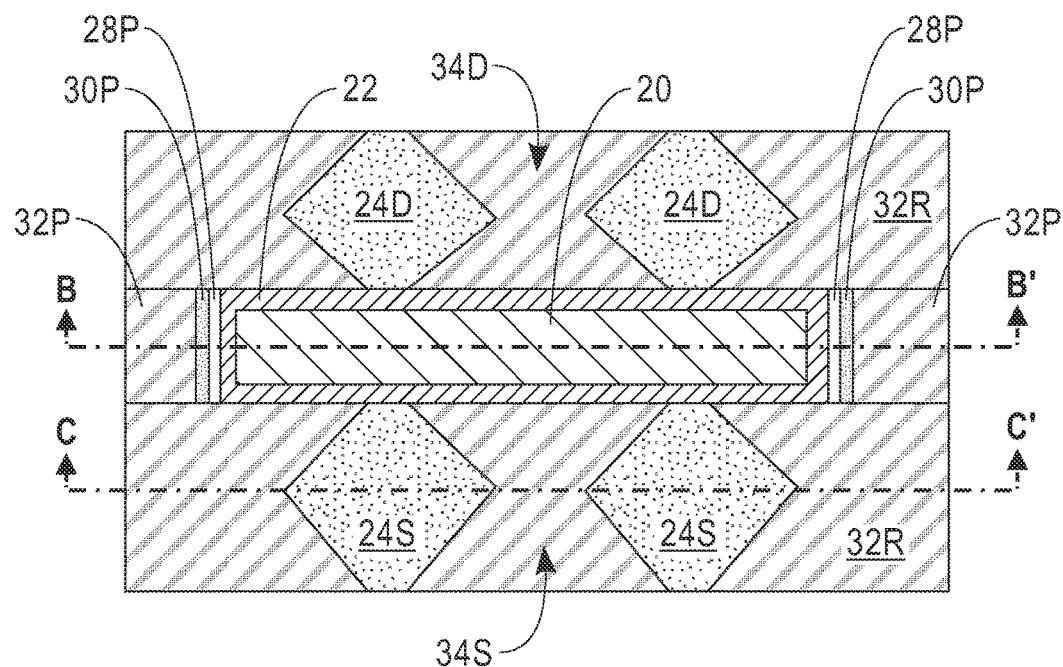
FIG. 9A is top down view of the exemplary semiconductor structure of FIGS. 8A-8C after removing the exposed bottom material layer of the etch stop structure that is located over each unmerged source-side epitaxial semiconductor material portion and each unmerged drain-side epitaxial semiconductor material portion.
Figure 9B:
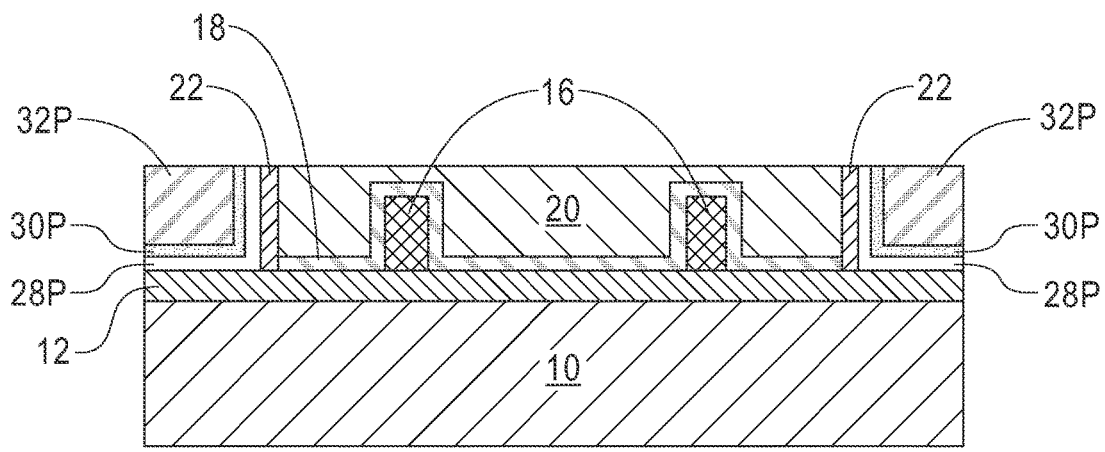
FIG. 9B is a cross sectional view of the exemplary semiconductor structure of FIG. 9A through vertical plane B-B'.
Figure 9C:
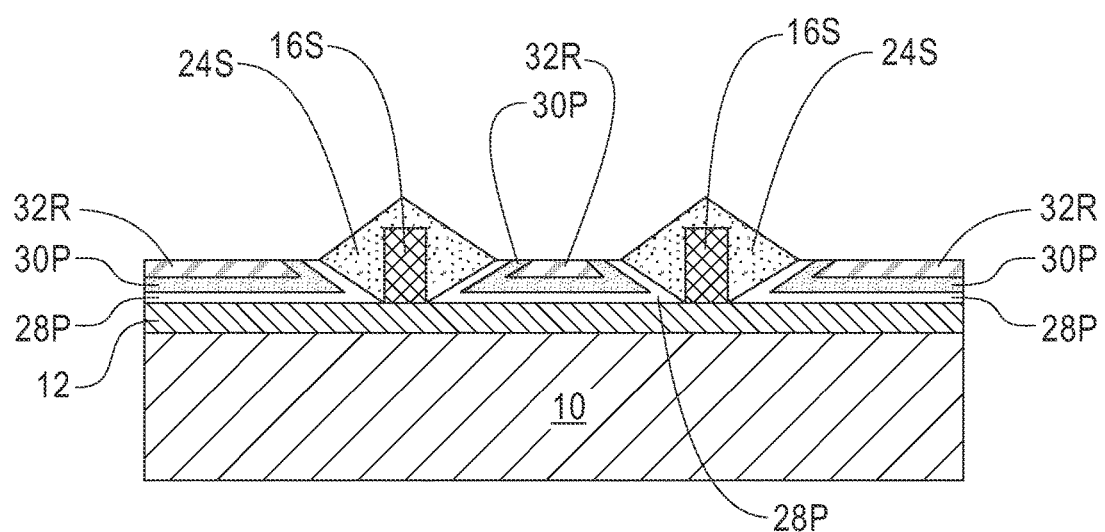
FIG. 9C is a cross sectional view of the exemplary semiconductor structure of FIG. 9A through vertical plane C-C'.

Referring now to FIGS. 9A-9C, there are illustrated the exemplary semiconductor structure of FIGS. 8A-8C after removing the exposed bottom material portion 28P of the etch stop structure that is located over each unmerged source-side epitaxial semiconductor material portion 24S and each unmerged drain-side epitaxial semiconductor material portion 24D. The exposed bottom material portion 28P can be removed utilizing an etching process that is selective in removing the material that provides the bottom material layer 28 of the etch stop structure. In one example, and when conformal amorphous carbon is used as the material for providing the bottom material layer 28 of the etch stop structure, a remote down-stream oxygen plasma can be used to remove the conformal amorphous carbon layer anisotropically from the top of the unmerged epitaxial semiconductor material. In another example, and when SiCN having the first C content is used as the bottom material layer 28 of the etch stop structure, a reaction ion etch can be used to remove the C rich portion selective to the unmerged epitaxial semiconductor material. The etch stops on the surface of the each unmerged source-side epitaxial semiconductor material portion 24S and each unmerged drain-side epitaxial semiconductor material portion 24D.

Figure 10A:
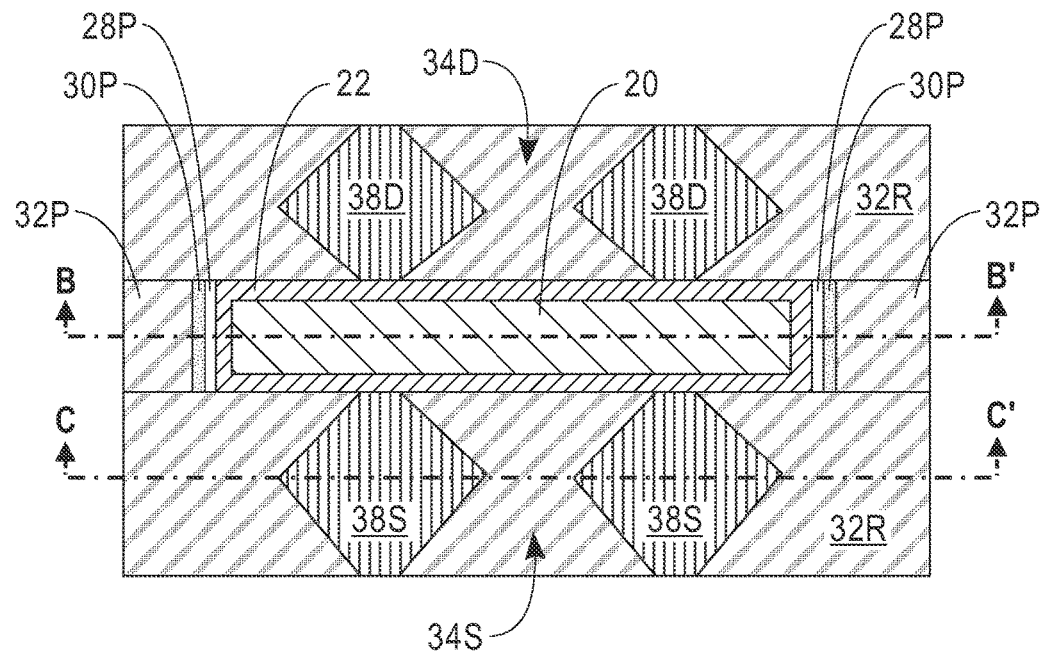
FIG. 10A is top down view of the exemplary semiconductor structure of FIGS. 9A-9C after forming a source-side metal semiconductor alloy portion on an exposed portion of each unmerged source-side epitaxial semiconductor material portion and a drain-side metal semiconductor alloy portion on an exposed portion of each unmerged drain-side epitaxial semiconductor material portion.
Figure 10B:
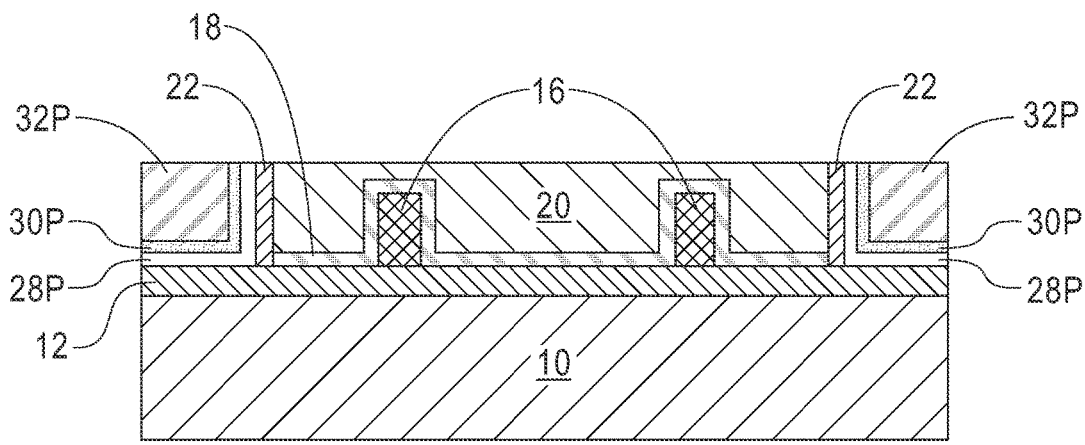
FIG. 10B is a cross sectional view of the exemplary semiconductor structure of FIG. 10A through vertical plane B-B'.
Figure 10C:
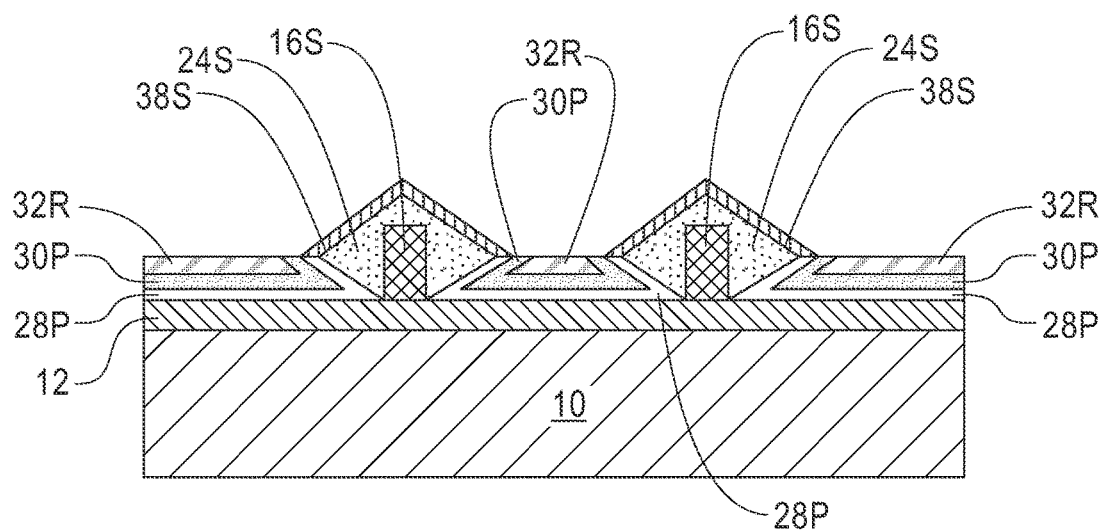
FIG. 10C is a cross sectional view of the exemplary semiconductor structure of FIG. 10A through vertical plane C-C'.

Referring now to FIGS. 10A-10C, there are illustrated the exemplary semiconductor structure of FIGS. 9A-9C after forming a source-side metal semiconductor alloy portion 38S on an exposed portion of each unmerged source-side epitaxial semiconductor material portion 24S and a drain-side metal semiconductor alloy portion 38D on an exposed portion of each unmerged drain-side epitaxial semiconductor material portion 24D. In some embodiments, and when the entirety of the planarized dielectric material 32 was removed during the formation of the source-side trench 34S and the drain-side trench 34D, the source-side metal semiconductor alloy portion 38S is present on the entirety of an underlying unmerged source-side epitaxial semiconductor material portion 24S and the drain-side metal semiconductor alloy portion 38D is present on an entirely of an underlying unmerged drain-side epitaxial semiconductor material portion 24D; see, for example, FIG. 12.

Each source-side metal semiconductor alloy portion 38S and each drain-side metal semiconductor alloy portion 38D can be formed by first depositing a metal semiconductor alloy forming metal such as for example, Ni, Pt, Co, and alloys such as NiPt, on a surface of each unmerged source-side epitaxial semiconductor material portion 24S and on a surface of each unmerged drain-side epitaxial semiconductor material portion 24D. An optional diffusion barrier layer such as, for example, TiN or TaN, can be deposited atop the metal semiconductor alloy forming metal. An anneal is then performed that causes reaction between the metal semiconductor alloy forming metal and the semiconductor material of the unmerged source-side epitaxial semiconductor material portion 24S and the unmerged drain-side epitaxial semiconductor material portion 24D. After annealing, any unreactive metal including the diffusion barrier layer can be removed. When Ni is used the NiSi phase is formed due to its low resistivity. For example, formation temperatures include 400° C.-600° C. In the present application, each source-side metal semiconductor alloy portion 38S and each drain-side metal semiconductor alloy portion 38D includes a same metal semiconductor alloy forming metal.

Each source-side metal semiconductor alloy portion 38S that is formed includes a metal semiconductor alloy forming metal, a semiconductor material as present within the source-side epitaxial semiconductor material portion 24S and a dopant as also present in the source-side epitaxial semiconductor material portion 24S. Each drain-side metal semiconductor alloy portion 38D that is formed includes a metal semiconductor alloy forming metal, a semiconductor material as present within the unmerged drain-side epitaxial semiconductor material portion 24D, and also a dopant as also present in the unmerged drain-side epitaxial semiconductor material portion 24D. The thickness of each source-side metal semiconductor alloy portion 38S and each drain-side metal semiconductor alloy portion 38D may range from 2 nm to 50 nm. Although thicknesses that are lesser than, or greater than, the aforementioned thickness range are also possible.

Figure 11A:
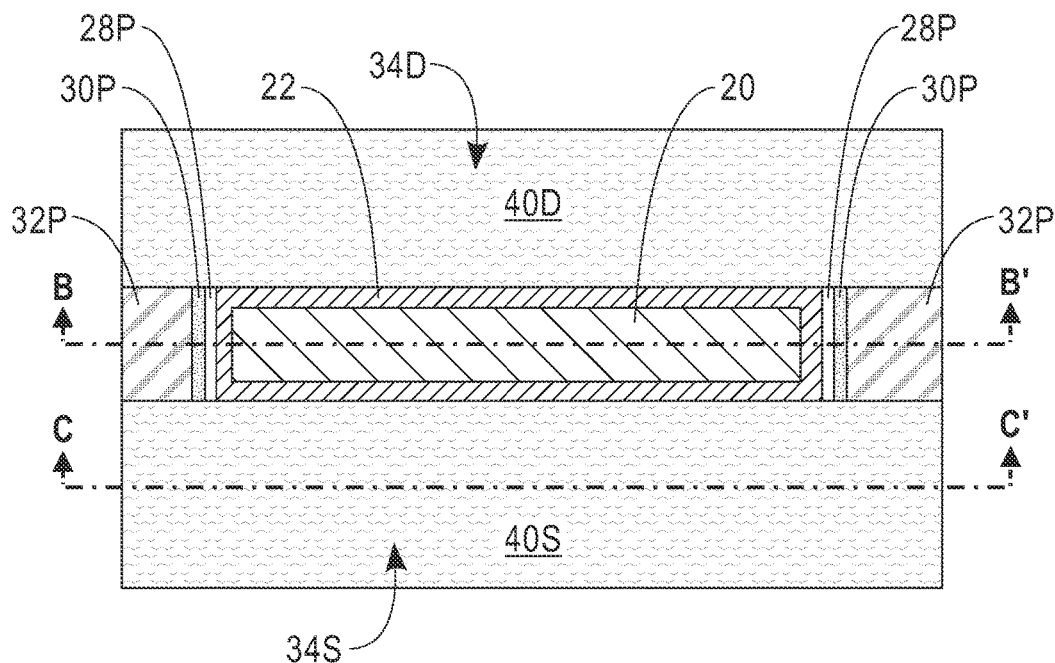
FIG. 11A is top down view of the exemplary semiconductor structure of FIGS. 10A-10C after forming a contact metal structure within the source-side trench and within the drain-side trench.
Figure 11B:
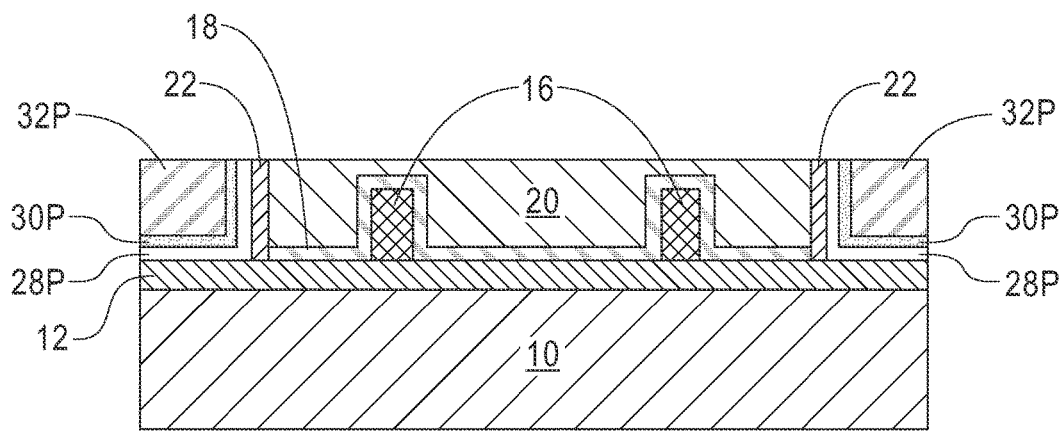
FIG. 11B is a cross sectional view of the exemplary semiconductor structure of FIG. 11A through vertical plane B-B'.
Figure 11C:
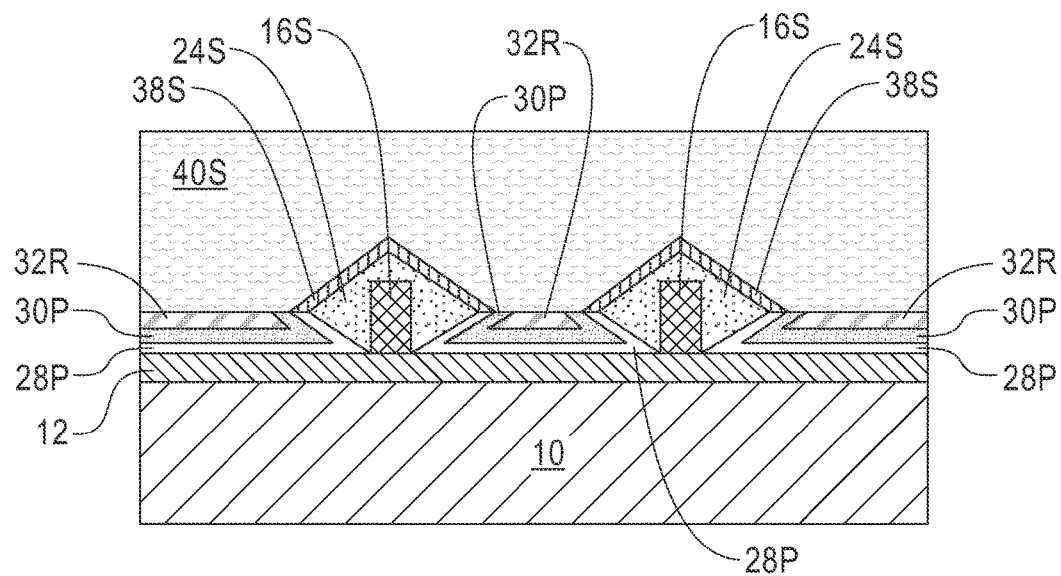
FIG. 11C is a cross sectional view of the exemplary semiconductor structure of FIG. 11A through vertical plane C-C'.

Referring now to FIGS. 11A-11C, there are illustrated the exemplary semiconductor structure of FIGS. 10A-10C after forming a source-side contact metal structure 40S within the source-side trench opening 34S and a drain-side contact metal structure 40D within the drain-side trench opening 34D. Each contact metal structure (40S, 40D) may include a contact metal such as, for example, Al, W, Cu, and alloys thereof. The contact metal can be formed by a deposition process such as, for example, plating, sputter, physical vapor deposition or chemical vapor deposition. In some embodiments, a planarization process such as, for example, chemical mechanical planarization may then be employed to provide the source-side contact metal structure 40S and the drain-side contact metal structure 40D. In other embodiments, no planarization process follows the deposition of the contact metal that provides the contact metal structures (40S, 40D).

Figure 12:
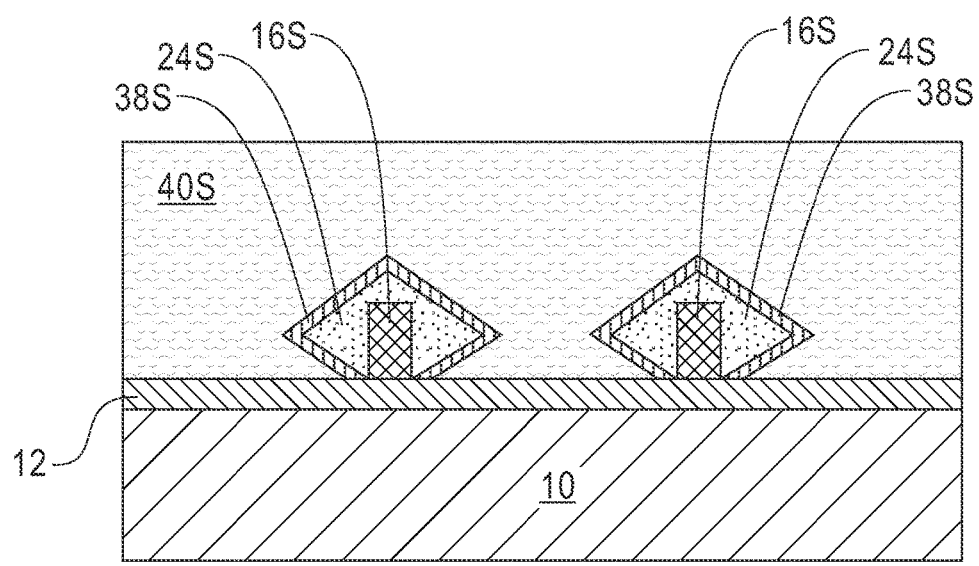
FIG. 12 is a cross sectional view through the source region of another exemplary semiconductor structure of the present application.

FIG. 12 illustrates the source region of another exemplary semiconductor structure in which the entirety of the planarized dielectric material and the entirety of the etch stop layer is removed from the structure prior to forming the metal semiconductor alloy portions and the contact metal structures.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:
1. A semiconductor structure comprising:
a plurality of semiconductor material fins located on a surface of a substrate;
at least one gate structure straddling over a portion of each semiconductor material fin of said plurality of semiconductor material fins;
unmerged source-side epitaxial semiconductor material portions located on an entirety of each sidewall surface and a topmost surface of each semiconductor material fin on one side of each gate structure;
unmerged drain-side epitaxial semiconductor portions located on an entirety of each sidewall surface and a topmost surface of each semiconductor material fin on another side of each gate structure;
an etch stop structure located between each unmerged source-side epitaxial semiconductor material portion and each unmerged drain-side epitaxial semiconductor material portion, wherein each etch stop structure comprises a bottom material portion and an upper material portion, said bottom material portion of said etch stop structure has a higher etch resistance in a specific etchant as compared to said upper material portion of said etch stop structure, wherein a topmost surface of said bottom material portion of said etch stop structure is coplanar with a topmost surface of said upper material portion of said etch stop structure, and a bottommost surface of said bottom material portion of said etch stop structure is coplanar with a bottommost surface of each semiconductor fin, and wherein an entirety of a bottom surface and sidewall surfaces of said upper material portion of said etch stop structure is in direct physical contact with said bottom material portion of said etch stop structure, and wherein each of said bottom material portions has a sidewall surface that is in direct physically contact with a sidewall surface of one of said unmerged source-side epitaxial semiconductor material portions or one of said unmerged drain-side epitaxial semiconductor material portions;
a recessed dielectric material portion present on said etch stop structure that is located between each unmerged source-side epitaxial semiconductor material portion and each unmerged drain-side epitaxial semiconductor material portion, said recessed dielectric material portion having a topmost surface that is located beneath a topmost surface of each of said unmerged source-side epitaxial semiconductor material portions and each of said unmerged drain-side epitaxial semiconductor material portions, and wherein said topmost surface of said recessed dielectric material portion is coplanar with said topmost surface of the upper material portion of the etch stop structure and the topmost surface of the lower material portion of the etch stop structure;

a source-side metal semiconductor alloy portion located on a surface of each of said unmerged source-side epitaxial semiconductor material portions and the topmost surface of said bottom material portion of said etch stop structure; and a drain-side metal semiconductor alloy portion located on a surface of each of said unmerged drain-side epitaxial semiconductor material portions and the topmost surface of said bottom material portion of said etch stop structure.

2. The semiconductor structure of claim 1, wherein said bottom material portion of said etch stop structure consists of amorphous carbon and said upper material portion of said etch stop structure consists of silicon nitride.

3. The semiconductor structure of claim 1, wherein said bottom material portion of said etch stop structure consists of SiCN having a first carbon content and said upper material portion of said etch stop structure consists of SiCN having a second carbon content which less than said first carbon content.

4. The semiconductor structure of claim 3, wherein said second carbon content is zero.

5. The semiconductor structure of claim 1, wherein each unmerged source-side epitaxial semiconductor material portion and each unmerged drain-side epitaxial semiconductor material portion has a faceted topmost surface.

6. The semiconductor structure of claim 5, wherein each unmerged source-side epitaxial semiconductor material portion and each unmerged drain-side epitaxial semiconductor material portion comprises a <111> bound diamond shaped epitaxy semiconductor material.

7. The semiconductor structure of claim 1, wherein a source-side contact metal structure is present on a surface of each of said source source-side metal semiconductor alloy portions and drain-side contact metal structure is present on a surface of each of said source-side metal semiconductor alloy portions.

8. The semiconductor structure of claim 1, wherein each etch stop structure has a bottommost surface that contacts a portion of underlying insulator layer.

* * * * *